(12) United States Patent
Lee

(10) Patent No.: US 12,536,962 B2
(45) Date of Patent: Jan. 27, 2026

(54) ELECTROSTATIC DISCHARGE CIRCUIT AND DISPLAY APPARATUS INCLUDING THE SAME

(71) Applicant: LG Display Co., Ltd., Seoul (KR)

(72) Inventor: Tae Won Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 19/054,441

(22) Filed: Feb. 14, 2025

(65) Prior Publication Data

US 2025/0279053 A1 Sep. 4, 2025

(30) Foreign Application Priority Data

Feb. 29, 2024 (KR) .................. 10-2024-0030333

(51) Int. Cl.
| | | |
|---|---|---|
| *G09G 3/32* | (2016.01) | |
| *G09G 3/20* | (2006.01) | |
| *G09G 3/3233* | (2016.01) | |
| *H10D 89/60* | (2025.01) | |
| *H10K 59/121* | (2023.01) | |
| *H10K 59/126* | (2023.01) | |
| *H10K 59/40* | (2023.01) | |
| *H10K 77/10* | (2023.01) | |
| *H10K 102/00* | (2023.01) | |

(52) U.S. Cl.
CPC ......... *G09G 3/3233* (2013.01); *G09G 3/2092* (2013.01); *H10D 89/814* (2025.01); *H10D 89/921* (2025.01); *H10K 59/1213* (2023.02); *H10K 59/126* (2023.02); *H10K 59/40* (2023.02); *H10K 77/111* (2023.02); *G09G 2300/0426* (2013.01); *G09G 2300/0842* (2013.01); *G09G 2330/04* (2013.01); *H10K 2102/311* (2023.02)

(58) Field of Classification Search
CPC ............... G09G 3/3233; G09G 3/2092; G09G 2300/0426; G09G 2300/0842; G09G 2330/04; H10D 89/814; H10D 89/921; H10D 89/811; H10D 89/931; H10K 59/1213; H10K 59/126; H10K 59/40; H10K 77/111; H10K 2102/311
See application file for complete search history.

(56) References Cited

U.S. PATENT DOCUMENTS

| | | | | |
|---|---|---|---|---|
| 2016/0078810 A1* | 3/2016 | Park | ..................... | G09G 3/3233 |
| | | | | 345/215 |
| 2016/0210900 A1* | 7/2016 | Kim | ..................... | G09G 3/3266 |
| 2017/0047011 A1* | 2/2017 | Yoon | ..................... | G09G 3/3233 |
| 2018/0350891 A1* | 12/2018 | Kim | ..................... | H10D 86/481 |
| 2020/0066212 A1* | 2/2020 | Kim | ..................... | G09G 3/3266 |

FOREIGN PATENT DOCUMENTS

KR 10-2023-0102030 A 7/2023

* cited by examiner

*Primary Examiner* — Pegeman Karimi
(74) *Attorney, Agent, or Firm* — Birch, Stewart, Kolasch & Birch, LLP

(57) ABSTRACT

An electrostatic discharge circuit and a display apparatus are discussed. The electrostatic discharge circuit can include a signal line configured to transmit a gate signal or a data signal, a first gate power voltage line, a second gate power voltage line, a first transistor and a second transistor disposed to overlap each other between the signal line and the second power voltage line, and a third transistor and a fourth transistor disposed to overlap each other between the signal line and the first power voltage line.

20 Claims, 10 Drawing Sheets

ELECTROSTATIC DISCHARGE CIRCUIT AND DISPLAY APPARATUS INCLUDING THE SAME

CROSS-REFERENCE TO RELATED APPLICATION

This application claims priority to Korean Patent Application No. 10-2024-0030333, filed in the Republic of Korea on Feb. 29, 2024, the entire contents of which is hereby expressly incorporated by reference into the present application.

BACKGROUND

Field

The present disclosure relates to an electrostatic discharge circuit and a display apparatus including the same.

Discussion of the Related Art

A display apparatus for displaying various types information on a screen is a core technology of the information and communication era and is being developed to be thinner, lighter, and more portable, and to have better performance. Accordingly, display apparatuses that can be manufactured in a lightweight and thin form are in the spotlight.

Specific examples of such display apparatuses include a liquid crystal display (LCD), a quantum dot (QD) display, a field emission display (FED), and an organic light emitting diode (OLED) display.

Among these various display apparatuses, organic light emitting display apparatuses are self-luminous display apparatuses, and unlike liquid crystal displays, they do not require a separate light source and thus can be manufactured in a lightweight and thin structure. In addition, organic display apparatuses are advantageous in terms of power consumption due to low-voltage operation and are also excellent in color implementation, response speed, viewing angle, and contrast ratio (CR), and thus they are being studied as displays.

SUMMARY OF THE DISCLOSURE

When static electricity is introduced into a display apparatus from the outside, the internal circuit of the display apparatus can malfunction or be damaged due to the static electricity.

An object of the present disclosure is to provide an electrostatic discharge circuit capable of protecting the internal circuit of a display apparatus from static electricity and the display device including the same.

Another object of the present disclosure is to provide an electrostatic discharge circuit capable of preventing or minimizing the occurrence of burnt of a transistor and a display apparatus including the same.

The objects of the present disclosure are not limited to the objects mentioned above, and other objects not mentioned will be clearly understood by those skilled in the art from the description below.

Additional advantages, objects, and features of the present disclosure will be set forth in part in the description which follows and in part will become apparent to those having ordinary skill in the art upon examination of the following or can be learned from practice of the present disclosure. The objectives and other advantages of the present disclosure can be realized and attained by the structure particularly pointed out in the written description and claims hereof as well as the appended drawings.

To achieve these objects and other advantages and in accordance with the purpose of the present disclosure, as embodied and broadly described herein, an electrostatic discharge circuit includes a signal line through which a gate signal or a data signal is transmitted, a first gate power voltage line, a second gate power voltage line, a first transistor and a second transistor disposed to overlap each other between the signal line and the second gate power voltage line, and a third transistor and a fourth transistor disposed to overlap each other between the signal line and the first gate power voltage line.

An electrostatic discharge circuit according to aspects of the present disclosure can include a signal line; a first gate power voltage line; a second gate power voltage line; a first transistor and a second transistor disposed between the signal line and the second gate power voltage line; and a third transistor and a fourth transistor disposed between the signal line and the first gate power voltage line, wherein, when a voltage higher than a first gate power voltage is applied to the signal line, the third transistor and the fourth transistor are turned on, and when a voltage lower than a second gate power voltage is applied to the signal line, the first transistor and the second transistor are turned on, such that a voltage at the signal line is maintained between the first gate power voltage and the second gate power voltage.

In yet another aspect of the present disclosure, a display apparatus includes a display panel displaying images, on which a plurality of data lines, a plurality of gate lines, and a plurality of pixels are arranged, an electrostatic discharge circuit connected to the plurality of data lines or the plurality of gate lines, a gate driving circuit configured to supply a scan signal to the plurality of gate lines, a data driving circuit configured to supply a data signal to the plurality of data lines, and a controller configured to control operation timings of the gate driving circuit and the data driving circuit.

Specific details of other embodiments of the present disclosure are included in the detailed description and drawings.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION OF THE EMBODIMENTS

Figure 1:
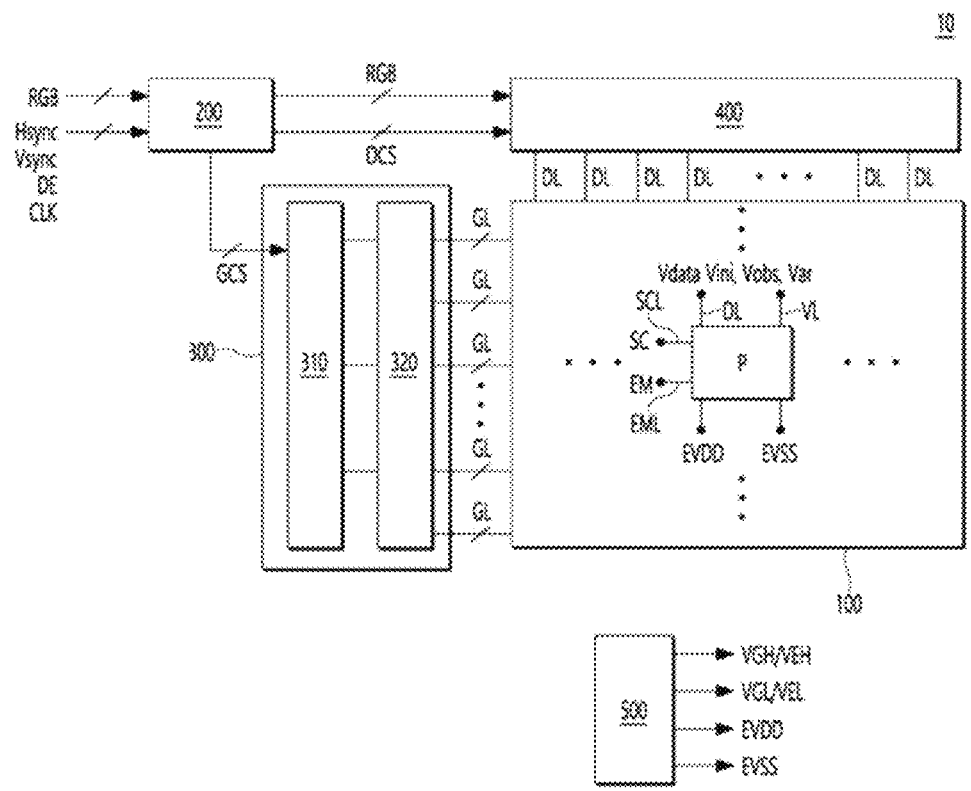
FIG. 1 is a block diagram showing a display apparatus according to one or more embodiments of the present disclosure.

Hereinafter, various embodiments of the present disclosure will be described with reference to the attached drawings. Throughout the disclosure, the same reference numerals refer to substantially the same components.

In the following description, if it is determined that a detailed description of known techniques associated with the present disclosure would unnecessarily obscure the gist of the present disclosure, detailed description thereof will be omitted. In addition, the component names used in the following description are selected in consideration of the ease of writing the disclosure, and can differ from the names of parts of the actual product.

Shapes, sizes, ratios, angles, numbers, etc. shown in the figures to describe embodiments of the present disclosure are exemplary and thus are not limited to particulars shown in the figures. Like numbers refer to like elements throughout the disclosure.

In the following description, if it is determined that a detailed description of known techniques associated with the present disclosure would unnecessarily obscure the gist of the present disclosure, detailed description thereof will be omitted or may be briefly provided.

It will be further understood that, when the terms "include", "have" and "comprise" are used in the present disclosure, other parts can be added unless "only" is used. An element described in the singular form is intended to include a plurality of elements unless context clearly indicates otherwise.

In interpretation of a component, the component is interpreted as including an error range unless otherwise explicitly described.

In describing various embodiments of the present disclosure, for example, when describing a positional relationship between two parts using "on", "above", "under", "by", or the like, one or more other parts can be located between the two parts unless "right" or "directly" is used.

In describing various embodiments of the present disclosure, for example, when describing a temporal chronological relationship between events using "after", "subsequently to", "next to", "before", or the like, cases where events are not continuous can also be included unless "right" or "directly" is used.

In the following description of various embodiments, "first" and "second" are used to describe various components, but such components are not limited by these terms. The terms are used to discriminate one component from another component. Accordingly, a first component mentioned in the following description can be a second component within the technical spirit of the present disclosure.

The features within various embodiments of the present disclosure can be partially or wholly combined with one another, and can be technically capable of various interconnections and operations, and the various embodiments can be implemented independently or can be implemented together in a related relationship. Further, the term "can" fully encompasses all the meanings and coverages of the term "may."

Hereinafter, a display apparatus according to various embodiments of the present disclosure will be described with reference to the drawings. All the components of each display apparatus according to all embodiments of the present disclosure are operatively coupled and configured.

FIG. 1 is a block diagram showing a display apparatus according to one or more embodiments of the present disclosure.

Figure 2:
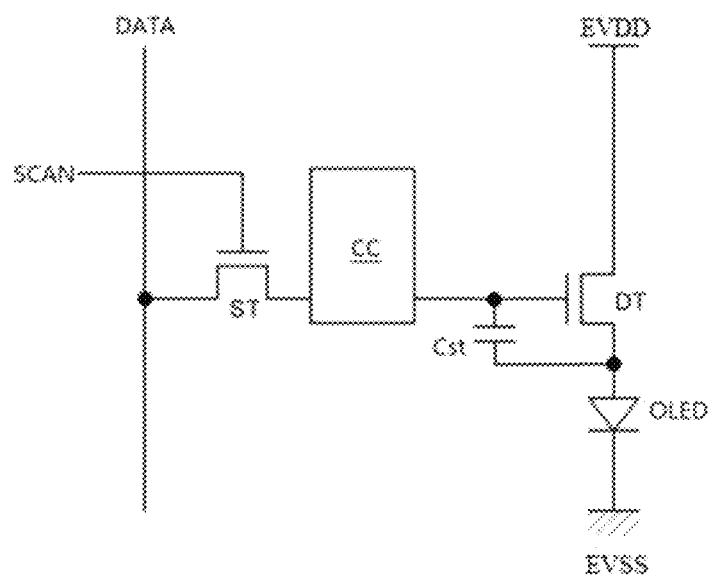
FIG. 2 is a circuit diagram of a pixel included in the display apparatus according to an embodiment of the present disclosure.

FIG. 2 is a circuit diagram of a pixel included in the display apparatus according to an embodiment of the present disclosure.

As shown in FIG. 1, a display apparatus 10 according to an embodiment of the present disclosure can include a panel that displays an image through pixels in which a plurality of gate lines and a plurality of data lines are arranged to intersect each other, and a driving circuit that drives the panel. The driving circuit can include a gate driving circuit and a data driving circuit, the gate driving circuit can drive the plurality of gate lines, and the data driving circuit can supply a data voltage to the plurality of data lines. For example, the display apparatus 10 according to an embodiment of the present disclosure can include a display panel 100, a data driving circuit 400, a gate driving circuit 300, a power supply 500, and a timing controller 200.

A plurality of pixels P can be disposed on the display panel 100. The plurality of pixels P can be disposed at regions where a plurality of data lines DL intersects a plurality of gate lines GL. The pixels P disposed on the same horizontal line can form a single pixel row. The pixels P disposed in a single pixel row are connected to a single gate line GL, and a single gate line GL can include at least one scan line and at least one emission line. For example, each pixel P can be connected to one data line DL and at least one scan line and one emission line, but the embodiments of the present disclosure are not limited thereto.

The data driving circuit 400 can drive the data lines DL. The gate driving circuit 300 can drive the gate lines GL. The power supply 500 can supply power required to operate each of the plurality of pixels P.

The plurality of pixels P can be commonly supplied with a high-level driving voltage ELVDD and a low-level driving voltage ELVSS from the power supply 500. The plurality of pixels P can be supplied with a bias voltage Vobs and an initialization voltage VAR (Vini) through a power line VL.

Thin film transistors (TFTs) constituting the pixels P can be implemented as oxide TFTs including an oxide semiconductor layer. When considering electron mobility, process deviation, etc., the oxide TFT can be advantageous for large-area display panel 100. The present disclosure is not limited thereto, and the semiconductor layer of the TFT can be formed of amorphous silicon or polysilicon.

Each pixel P can include a light emitting element (organic light emitting diode (OLED)), a driving TFT that supplies current to the light emitting element, a switching TFT that supplies a data voltage to the driving TFT, and a storage capacitor that holds the data voltage supplied to the driving TFT. The storage capacitor can maintain the data voltage for one frame. Although the light emitting element is described as an OLED in the present disclosure, the light emitting element is not limited to an OLED. The light emitting element can include an organic light emitting element, an inorganic light emitting element, a micro-LED, a mini-LED, and the like, and the embodiments of the present disclosure are not limited thereto.

Each pixel P can further include a plurality of TFTs and a storage capacitor to compensate for a threshold voltage change in the driving TFT.

Each pixel P can include a switching transistor ST, a driving transistor DT, a compensation circuit CC, a light emitting element OLED, and a storage capacitor Cst, as illustrated in FIG. 2.

The light emitting element OLED can operate to emit light according to a driving current generated by the driving transistor DT. For example, the light emitting element OLED can include an inorganic light emitting element, an organic light emitting element, a quantum dot light emitting element, a micro-LED element, or a mini-LED element, but the embodiments of the present disclosure are not limited thereto.

The switching transistor ST can perform a switching operation such that a data signal supplied through a data line DL is stored as a data voltage in the storage capacitor Cst in response to a scan signal supplied through a gate line GL.

The driving transistor DT can operate such that a constant driving current flows between a high-level power line EVDD and a low-level power line EVSS in response to the data voltage stored in the storage capacitor Cst.

The compensation circuit CC can be a circuit for compensating for the threshold voltage of the driving transistor DT. The compensation circuit CC can include one or more thin film transistors and a capacitor. The configuration of the compensation circuit CC can vary depending on the compensation method.

For example, the pixel P illustrated in FIG. 2 is configured in a 2T (Transistor) 1C (Capacitor) structure including the switching transistor ST, the driving transistor DT, the storage capacitor Cst, and the light emitting element OLED, but if the compensation circuit CC is added, the pixel P can be configured in various manners such as 3T1C, 4T2C, 5T2C, 6T1C, 6T2C, 7T1C, 7T2C, and 8T1C.

Touch sensors can be arranged on the display panel 100. The touch unit can include touch sensors. Touch input can be sensed using separate touch sensors or can be sensed through pixels P. The touch sensors can be implemented as on-cell type or add on type touch sensors arranged on the screen of the display panel or implemented as in-cell type touch sensors built into the display panel 100, but the embodiments of the present disclosure are not limited thereto.

The timing controller 200 can control driving timing of the data driving circuit 400 and the gate driving circuit 300. The timing controller 200 can rearrange digital video data RGB input from the outside such that the digital video data RGB is suitable for the resolution of the display panel 100 and supply the same to the data driving circuit 400.

In addition, the timing controller 200 can generate a data control signal DDC for controlling the operation timing of the data driving circuit 400 and a gate control signal GDC for controlling the operation timing of the gate driving circuit 300 on the basis of timing signals such as a vertical synchronization signal Vsync, a horizontal synchronization signal Hsync, a dot clock signal DCLK, and a data enable signal DE.

The timing controller 200 can multiply an input frame frequency by i and control the operation timing of the display panel driver at a frame frequency of the input frame frequency×i (i being a positive integer greater than 0) Hz. The input frame frequency can be 60 Hz in the National Television Standards Committee (NTSC) format and 50 Hz in the Phase-Alternating Line (PAL) format, but the embodiments of the present disclosure are not limited thereto.

The data driving circuit 400 can convert digital video data RGB input from the timing controller 200 into an analog data voltage on the basis of the data control signal DDC and provide the analog data voltage to each data line DL.

The data driving circuit 400 can include one or more source drive integrated circuits (ICs) SICs. The source drive IC can generate a data voltage by converting digital video data of an input image into an analog gamma compensation voltage under the control of the timing controller 200 and output the data voltage to the data lines DL. The source drive IC can be mounted on a flexible circuit board, for example, in the form of a chip on film (COF), or can be directly bonded onto a substrate of a non-display area of the display panel 100 using a COG process, but the embodiments of the present disclosure are not limited thereto.

COFs can be bonded to a pad area of the display panel 100 and a source printed circuit board (PCB) through an anisotropic conductive film (ACF). Input pins of the COFs can be electrically connected to output terminals (pads) of the source PCB. Output pins of source COFs can be electrically connected to data pads formed on the substrate of the display panel 100 through an ACF.

For another example, the driver IC can be disposed on the display panel. For example, the driver IC can be disposed in the form of a chip on panel (COP), but the embodiments of the present disclosure are not limited thereto.

Although FIG. 1 illustrates that the data driving circuit 400 is disposed on one side of the display panel 100, the number and placement position of the data driving circuit 400 are not limited thereto. For example, the data driving circuit 400 can be composed of a plurality of integrated circuits (ICs) and disposed on one side of the display panel 100, but the embodiments of the present disclosure are not limited thereto.

The gate driving circuit 300 can generate a scan signal and an emission signal based on the gate control signal GDC. The gate driving circuit 300 can include at least one scan driver 310 and an emission driver 320.

At least one scan driver 310 can generate a scan signal SC in a row-sequential manner and supply the same to the gate lines GL to drive at least one scan line SCL connected to each pixel row. At least one scan driver 310 can output a scan pulse in response to a start pulse and a shift clock from a timing controller 200 and shift the scan pulse in accordance with a shift clock timing.

The emission driver 320 can generate an emission control signal EM in a row-sequential manner to drive at least one emission line EML connected to each pixel row and supply the same to emission lines. The emission driver 320 can output an emission control signal pulse in response to a start pulse and a shift clock from the timing controller 200 and sequentially shift the emission control signal pulse in accordance with the shift clock.

The scan signal SC can include a scan pulse that swings between a gate-on voltage VGL and a gate-off voltage VGH. The emission control signal EM can include an emission control signal pulse that swings between a gate-on voltage VEL and a gate-off voltage VEH. The scan pulse can be used to select pixels (P) of a line to which a data voltage Vdata will be written. The emission control signal EM can define a light emitting time of the pixels P.

The gate lines GL can be used to supply the scan signal SC and the emission control signal EM to the plurality of pixels P, and the data lines DL can be used to supply a data voltage Vdata to the plurality of pixels P. According to various embodiments, the gate lines GL can include a plurality of scan lines SCL for supplying the scan signal SC and a plurality of emission control signal lines EML for supplying the emission control signal EM.

The power supply 500 can generate DC power required to drive the pixel array of the display panel 100 and the display panel driver using a DC-DC converter. The DC-DC converter can include a charge pump, a regulator, a buck converter, a boost converter, etc., but the embodiments of the present disclosure are not limited thereto.

The power supply 500 can receive a DC input voltage from a host system and generate DC voltages such as the gate-on voltage VGL and VEL, the gate-off voltage VGH and VEH, a high-level driving voltage EVDD, and a low-level driving voltage EVSS.

The gate-on voltage VGL and VEL and the gate-off voltage VGH and VEH can be supplied to a level shifter and the gate driving circuit 300. The high-level driving voltage ELVDD and the low-level driving voltage ELVSS can be supplied in common to the pixels P.

The plurality of pixels P of the display panel 100 can include at least a first pixel, a second pixel, and a third pixel. The first pixel, the second pixel, and the third pixel can emit lights of different colors. For example, the first pixel can be a red pixel, the second pixel can be a green pixel, and the third pixel can be a blue pixel, but the embodiments of the present disclosure are not limited thereto. For example, the plurality of pixels P can further include a fourth pixel, and the fourth pixel can be a white pixel.

The plurality of pixels P can have the same size or different sizes. The first pixel, the second pixel, and the third pixel can be configured to have different sizes in consideration of the lifespan of the light emitting elements included in the first pixel, the second pixel, and the third pixel, or the color balance, but the embodiments of the present disclosure are not limited thereto.

Figure 3:
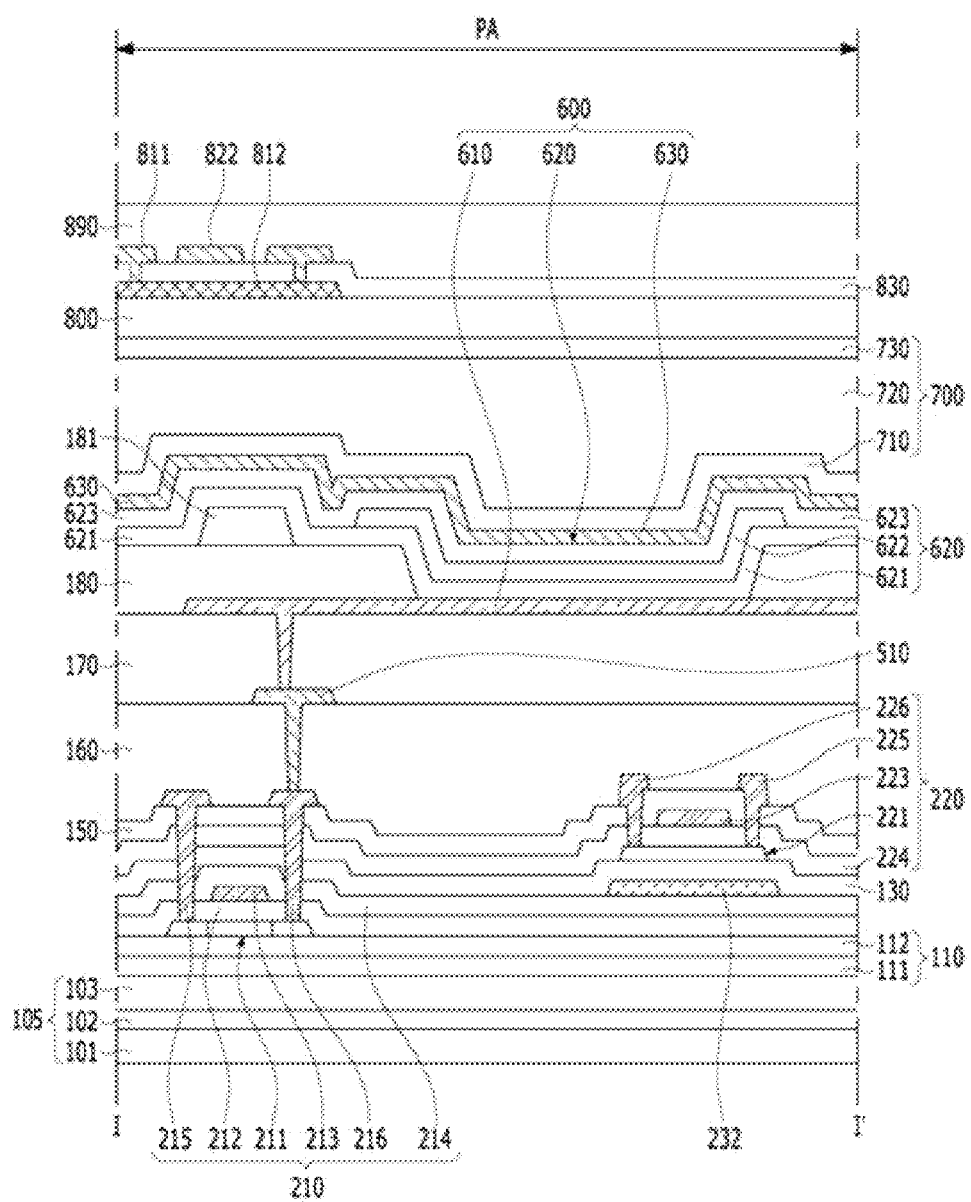
FIG. 3 is a cross-sectional view showing the display apparatus according to an embodiment of the present disclosure.

FIG. 3 is a cross-sectional view showing the display apparatus according to an embodiment of the present disclosure.

Referring to FIG. 3, the display apparatus according to an embodiment of the present disclosure can include a substrate 105. The substrate 105 can include an insulating material. For example, the substrate 105 can include glass or plastic, but the embodiments of the present disclosure are not limited thereto. The substrate 105 can have a multilayer structure, but the embodiments of the present disclosure are not limited thereto. For example, the substrate 105 can have a structure in which a first substrate layer 101, an insulating layer 102, and a second substrate layer 103 are sequentially disposed or laminated, but the embodiments of the present disclosure are not limited thereto. The second substrate layer 103 can include the same material as the first substrate layer 101, but the embodiments of the present disclosure are not limited thereto. For example, the first substrate layer 101 and the second substrate layer 103 can include a polymer material such as polyimide (PI), but the embodiments of the present disclosure are not limited thereto. The insulating layer 102 can include an insulating material. Accordingly, in the display apparatus according to the embodiment of the present disclosure, the substrate 105 can have flexibility. Therefore, in the display apparatus according to the embodiment of the present disclosure, damage to the substrate 105 due to bending stress can be prevented.

The substrate 105 can include a display area, a bending area, and a pad area, but the embodiments of the present disclosure are not limited thereto. The bending area can be located between the display area and the pad area, but the embodiments of the present disclosure are not limited thereto. An image to be provided to a user can be displayed in the display area (or active area AA). For example, the display area can include a plurality of pixel areas PA. Each pixel area PA can express a specific color. For example, a light emitting element 600 can be disposed in each pixel area PA. The light emitting element 600 can emit light representing a specific color. For example, the light emitting element 600 can include a first electrode 610, an emission layer 620, and a second electrode 630 disposed or laminated on the substrate 105.

The first electrode 610 can include a conductive material. The first electrode 610 can be formed of a material having a high reflectivity. For example, the first electrode 610 can include a metal such as aluminum (Al) and silver (Ag), but the embodiments of the present disclosure are not limited thereto. The first electrode 610 can have a multilayer structure, but the embodiments of the present disclosure are not limited thereto. For example, the first electrode 610 can have a structure in which a reflective electrode made of a metal is disposed between transparent electrodes made of a transparent conductive material such as ITO and IZO, but the embodiments of the present disclosure are not limited thereto.

The emission layer 620 can generate light with a brightness corresponding to the voltage difference between the first electrode 610 and the second electrode 620. For example, the emission layer 620 can include an emission material layer (EML) 622 containing an emission material. The emission material can include an organic material, an inorganic material, or a hybrid material. For example, the display apparatus according to the embodiment of the present disclosure can be an OLED display device in which the emission layer 620 includes an emission material layer 622 made of an organic material. Without being limited thereto, the emission layer 620 can include an inorganic emission material. For example, the emission layer 620 can be formed of a material including a quantum dot, a micro-LED, or a mini-LED, but the embodiments of the present disclosure are not limited thereto.

The emission layer 620 can have a multilayer structure. For example, the emission layer 620 can include at least one of a first common layer 621 positioned between the first electrode 610 and the emission material layer 622 or a second common layer 623 positioned between the emission material layer 622 and the second electrode 630. Each of the first common layer 621 and the second common layer 623 can include at least one of a hole injection layer (HIL), a hole transport layer (HTL), a hole blocking layer (HBL), an electron blocking layer (EBL), an electron transport layer (ETL), or an electron injection layer (EIL), but the embodiments of the present disclosure are not limited thereto. For example, in the display apparatus according to the embodiment of the present disclosure, the first common layer 621 can include at least one of the hole injection layer (HIL), the electron blocking layer (EBL), or the hole transport layer (HTL), and the second common layer 623 can include at least one of the electron transport layer (ETL), the hole blocking layer (HBL), or the electron injection layer (EIL), but the embodiments of the present disclosure are not limited thereto.

The second electrode 630 can include a conductive material. The second electrode 630 can include a different material from the first electrode 610, but the embodiments of the present disclosure are not limited thereto. For example, the second electrode 630 can be a transparent electrode made of a transparent conductive material such as ITO and IZO, but the embodiments of the present disclosure are not limited thereto. The second electrode 630 can have higher transmittance than the first electrode 610. Accordingly, in the display apparatus according to the embodiment of the present disclosure, light generated from the emission layer 620 can be emitted through the second electrode 630.

A driving circuit can be disposed in each pixel area PA. The driving circuit can generate a driving current provided to the light emitting element 600. The driving circuit can be electrically connected to signal lines GL, DL, ELVDD, and ELVSS. For example, each pixel area PA can be configured by signal lines GL, DL, ELVDD, and ELVSS. The signal lines GL, DL, ELVDD, and ELVSS can transmit various signals for implementing an image. For example, the signal lines GL, DL, ELVDD, and ELVSS can include gate lines GL through which a gate signal is applied, data lines DL through which a data signal is applied, and power voltage supply lines ELVDD and ELVSS through which a power voltage is supplied, but the embodiments of the present disclosure are not limited thereto. The driving circuit can generate a driving current corresponding to a data signal according to a gate signal. The operation of the light emitting element 600 can be maintained for one frame. For example, the driving circuit can include a first thin film transistor 210 and a second thin film transistor 220, but the embodiments of the present disclosure are not limited thereto.

The first thin film transistor 210 can be electrically connected to the light emitting element 600. The first thin film transistor 210 can supply a driving current corresponding to a data signal to the light emitting element 600. For example, the first thin film transistor 210 can be disposed between the light emitting element 600 and one of the power voltage supply lines ELVDD and ELVSS. The first thin film transistor 210 can include a first semiconductor layer 211, a first gate electrode 213, a second insulating film 214, a first source electrode 215, and a first drain electrode 216.

The first semiconductor layer 211 can be positioned close to the substrate 105. The first semiconductor layer 211 can include a semiconductor material. For example, the first semiconductor layer 211 can include silicon, but the embodiments of the present disclosure are not limited thereto. The first semiconductor layer 211 can include a polycrystalline semiconductor, but the embodiments of the present disclosure are not limited thereto. For example, the first semiconductor layer 211 can include polysilicon or low temperature polysilicon (LTPS), but the embodiments of the present disclosure are not limited thereto. For another example, the first semiconductor layer 211 can include an oxide semiconductor, but the embodiments of the present disclosure are not limited thereto. The first semiconductor layer 211 can include a first source region, a first drain region, and a first channel region. The first channel region can be disposed between the first source region and the first drain region. The first channel region can have lower electrical conductivity than the first source region and the first drain region. For example, the first source region and the first drain region can include a higher content of conductive impurities than the first channel region, but the embodiments of the present disclosure are not limited thereto.

A first insulating film 212 can be disposed on the first semiconductor layer 211. The first insulating film 212 can extend to the outside of the first semiconductor layer 211. For example, the side surface of the first semiconductor layer 211 can be covered by the first insulating film 212. The first insulating film 212 can include an insulating material. For example, the first insulating film 212 can include silicon oxide (SiOx) and/or silicon nitride (SiNx), but the embodiments of the present disclosure are not limited thereto. The silicon oxide (SiOx) can include silicon dioxide (SiO2). The first insulating film 212 can include a material having a high dielectric constant. For example, the first insulating film 212 can include a material such as hafnium oxide (HfO), but the embodiments of the present disclosure are not limited thereto. The first insulating film 212 can be an interlayer insulating film, but the embodiments of the present disclosure are not limited thereto.

The first gate electrode 213 can be disposed on the first insulating film 212. The first gate electrode 213 can include a conductive material. For example, the first gate electrode 213 can include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first gate electrode 213 can be insulated from the first semiconductor layer 211 by the first insulating film 212. The first gate electrode 213 can overlap the first channel region of the first semiconductor layer 211. For example, the first channel region of the first semiconductor layer 211 can have an electrical conductivity corresponding to a voltage applied to the first gate electrode 213.

The second insulating film 214 can be disposed on the first gate electrode 213. The second insulating film 214 can extend to the outside of the first gate electrode 213. For example, the side surface of the first gate electrode 213 can be covered by the second insulating film 214. The second insulating film 214 can extend along the first insulating film 212. The second insulating film 214 can include an insulating material. For example, the second insulating film 214 can include silicon oxide (SiOx) and/or silicon nitride (SiNx), but the embodiments of the present disclosure are not limited thereto. The silicon oxide (SiOx) can include silicon dioxide (SiO2). The second insulating film 214 can include a material having a high dielectric constant. For example, the second insulating film 214 can include a material such as hafnium oxide (HfO), but the embodiments of the present disclosure are not limited thereto. The second insulating film 214 can be a gate insulating film, but the embodiments of the present disclosure are not limited thereto.

The first source electrode 215 can be disposed on the second insulating film 214. The first source electrode 215 can be insulated from the first gate electrode 213 by the second insulating film 214. The first source electrode 215 can include a different material from the first gate electrode 213, but the embodiments of the present disclosure are not limited thereto. The first source electrode 215 can include a conductive material. For example, the first source electrode 215 can include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first source electrode 215 can be electrically connected to the first source region of the first semiconductor layer 211.

The first drain electrode 216 can be disposed on the second insulating film 214. The first drain electrode 216 can include a conductive material. For example, the first drain electrode 216 can include a single layer or multiple layers including one of aluminum (Al), chromium (Cr), copper (Cu), titanium (Ti), molybdenum (Mo), and tungsten (W) or an alloy thereof, but the embodiments of the present disclosure are not limited thereto. The first drain electrode 216 can be insulated from the first gate electrode 213 by the second insulating film 214. The first drain electrode 216 can include a different material from the first gate electrode 213, but the embodiments of the present disclosure are not limited thereto. For example, the first drain electrode 216 can include the same material as the first source electrode 215, but the embodiments of the present disclosure are not limited thereto. The first drain electrode 216 and the first source electrode 215 can be formed through the same process, but the embodiments of the present disclosure are not limited thereto. The first drain electrode 216 can be electrically connected to the first drain region of the first semiconductor layer 211. The first drain electrode 216 can be spaced apart from the first source electrode 215.

The second thin film transistor 220 can be electrically connected to the first thin film transistor 210. The second thin film transistor 220 can transmit a data signal to the first gate electrode 213 of the first thin film transistor 210 according to a scan signal. For example, the second thin film transistor 220 can be disposed between a data line DL and the first gate electrode 213 of the first thin film transistor 210. The structure of the second thin film transistor 220 can be the same as the structure of the first thin film transistor 210, but the embodiments of the present disclosure are not limited thereto. For example, the second thin film transistor 220 can include a second semiconductor layer 221, a second gate electrode 223, a second source electrode 225, and a second drain electrode 226.

The second semiconductor layer 221 can include a semiconductor material. The second semiconductor layer 221 can include the same material as the first semiconductor layer 211 or a different material. For example, the second semiconductor layer 221 can include silicon, but the embodiments of the present disclosure are not limited thereto. The second semiconductor layer 221 can include a polycrystalline semiconductor, but the embodiments of the present disclosure are not limited thereto. For example, the second semiconductor layer 221 can be an oxide semiconductor such as IGZO, but the embodiments of the present disclosure are not limited thereto. For another example, the second semiconductor layer 221 can include polysilicon or low temperature polysilicon (LTPS), but the embodiments of the present disclosure are not limited thereto.

The second semiconductor layer 221 can be disposed on a different layer from the first semiconductor layer 211, but the embodiments of the present disclosure are not limited thereto. For example, a first protective film 130 can be positioned on the second insulating film 214, and the second semiconductor layer 221 can be disposed on the first protective film 130. The first protective film 130 can include silicon oxide (SiOx) or silicon nitride (SiNx), but the embodiments of the present disclosure are not limited thereto. Accordingly, in the display apparatus according to the embodiments of the present disclosure, damage to the second semiconductor layer 221 due to the formation process of the first semiconductor layer 211 can be prevented.

The second semiconductor layer 221 can include a second source region, a second drain region, and a second channel region. The second channel region can be disposed between the second source region and the second drain region. The second source region and the second drain region can have lower resistance than the second channel region. For example, the second source region and the second drain region can include a conductive region of an oxide semiconductor. The second channel region can be a non-conductive region of the oxide semiconductor, but the embodiments of the present disclosure are not limited thereto.

A fourth insulating film 224 can be disposed on the second semiconductor layer 221. The fourth insulating film 224 can include an insulating material. The fourth insulating film 222 can include the same material as the first insulating film 212, but the embodiments of the present disclosure are not limited thereto. For example, the fourth insulating film 224 can have a multilayer structure, but the embodiments of the present disclosure are not limited thereto.

The second gate electrode 223 can be disposed on the fourth insulating film 224. For example, the second gate electrode 223 can overlap the second channel region of the second semiconductor layer 221. The second gate electrode 223 can include a conductive material. For example, the second gate electrode 223 can include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The second gate electrode 223 can include the same material as the first gate electrode 213, but the embodiments of the present disclosure are not limited thereto. The second gate electrode 223 can be insulated from the second semiconductor layer 221 by the fourth insulating film 224. For example, the second channel region of the second semiconductor layer 221 can have an electrical conductivity corresponding to a voltage applied to the second gate electrode 223, but the embodiments of the present disclosure are not limited thereto.

A second protective film 150 can be disposed on the fourth insulating film 224. The second protective film 150 can include silicon oxide (SiOx) or silicon nitride (SiNx), but the embodiments of the present disclosure are not limited thereto.

The second source electrode 225 can be disposed on the second protective film 150. The second source electrode 225 can include a conductive material. For example, the second source electrode 225 can include one of aluminum (Al), chromium (Cr), copper (Cu), titanium (Ti), molybdenum (Mo), and tungsten (W), or an alloy thereof, but the embodiments of the present disclosure are not limited thereto. The second source electrode 225 can include the same material as the first source electrode 215, but the embodiments of the present disclosure are not limited thereto. The second source electrode 225 can be insulated from the second gate electrode 223 by the fourth insulating film 224. The second source electrode 225 can include a different material from the second gate electrode 223, but the embodiments of the present disclosure are not limited thereto. The second source electrode 225 can be electrically connected to the second source region of the second semiconductor layer 221. For example, the fourth insulating film 224 and the second protective film 150 can include a second source contact hole that partially exposes the second source region of the second semiconductor layer 221. The second source electrode 225 can include a region overlapping the second source region of the second semiconductor layer 221. For example, the second source electrode 225 can be in contact with the second source region of the second semiconductor layer 221 within the second source contact hole.

The second drain electrode 226 can be disposed on the second protective film 150. The second drain electrode 226 can include a conductive material. For example, the second drain electrode 226 can include a single layer or double layer including one of aluminum (Al), chromium (Cr), copper (Cu), titanium (Ti), molybdenum (Mo), and tungsten (W), or an alloy thereof, but the embodiments of the present disclosure are not limited thereto. The second drain electrode 226 can include the same material as the first drain electrode 216, but the embodiments of the present disclosure are not limited thereto. The second drain electrode 226 can be insulated from the second gate electrode 223 by the fourth insulating film 224. The second drain electrode 226 can include a different material from the second gate electrode 223, but the embodiments of the present disclosure are not limited thereto. For example, the second drain electrode 226 can include the same material as the second source electrode 225, but the embodiments of the present disclosure are not limited thereto. The second drain electrode 226 and the second source electrode 225 can be formed through the same process, but the embodiments of the present disclosure are not limited thereto. The second drain electrode 226 can be electrically connected to the second drain region of the second semiconductor layer 221. The second drain electrode 226 can be spaced apart from the second source electrode 225. For example, the fourth insulating film 224 and the second protective film 150 can include a second drain contact hole that partially exposes the second drain region of the second semiconductor layer 221. The second drain electrode 226 can include a region overlapping the second drain region of the second semiconductor layer 221. For example, the second drain electrode 226 can be in contact with the second drain region of the second semiconductor layer 221 within the second drain contact hole.

The second thin film transistor 220 can further include an auxiliary layer 232 under the second semiconductor layer 221. The auxiliary layer 232 can overlap the second semiconductor layer 221. For example, the auxiliary layer 232 can include a single layer or multiple layers including one of aluminum (Al), chromium (Cr), copper (Cu), titanium (Ti), molybdenum (Mo), nickel (Ni), neodymium (Nd), and tungsten (W) or an alloy thereof, but the embodiments of the present disclosure are not limited thereto. The auxiliary layer 232 can prevent light from reaching the second semiconductor layer 221, thereby extending the lifespan of the second thin film transistor 220. For example, the auxiliary layer 232 can be a light-shielding layer, but the embodiments of the present disclosure are not limited thereto. For example, another auxiliary layer can be formed under the first thin film transistor 210. Another auxiliary layer can be disposed on a buffer layer 112. When another auxiliary layer is formed, an insulating film can be further formed on the buffer layer 112. The other auxiliary layer can be formed of the same material as the auxiliary layer 232, but the embodiments of the present disclosure are not limited thereto. Since the other auxiliary layer can prevent light from reaching the first semiconductor layer 211, the lifespan of the first thin film transistor 210 can be extended.

A buffer film 110 can be disposed between the substrate 105 and the driving circuit of each pixel area PA. The buffer film 110 can prevent contamination by the substrate 105 during a driving circuit formation process. For example, the buffer film 110 can cover the display area AA of the substrate 105. For example, the buffer film 110 can completely cover the display area AA of the substrate 105. The buffer film 110 can be disposed between the substrate 105 and the first semiconductor layer 211 of each pixel area PA. The buffer film 110 can include an insulating material. For example, the buffer film 110 can include an inorganic insulating material such as silicon oxide (SiOx) and silicon nitride (SiNx), but the embodiments of the present disclosure are not limited thereto. The buffer film 110 can have a multilayer structure, but the embodiments of the present disclosure are not limited thereto. For example, the buffer film 110 can have a laminated structure of a first buffer layer 111 and a second buffer layer 112 including a different material from the first buffer layer 111, but the embodiments of the present disclosure are not limited thereto.

The first protective film 130 can prevent damage to the first thin film transistor 210 due to external impact and moisture. The first protective film 130 can extend between the auxiliary layer 232 and the second semiconductor layer 221 of each pixel area PA. Accordingly, in the display apparatus according to the embodiment of the present disclosure, damage to the first thin film transistors 210 due to external impact and moisture can be effectively prevented.

The second protective film 150 can be disposed between the fourth insulating film 224 and the second source electrode 225 and between the fourth insulating film 224 and the second drain electrode 226 in each pixel area PA. The second protective film 150 can prevent damage to the second semiconductor layer 221 due to external impact and moisture. For example, the second protective film 150 can extend to the outside of the second semiconductor layer 221 along the fourth insulating film 224. The second protective film 150 can include a different material from the fourth insulating film 224, but the embodiments of the present disclosure are not limited thereto. For example, the second protective film 150 can include silicon nitride (SiNx), but the embodiments of the present disclosure are not limited thereto. Accordingly, in the display apparatus according to the embodiment of the present disclosure, damage to the second semiconductor layer 221 due to external impact and moisture can be effectively prevented.

The first source electrode 215 of the first thin film transistor can be disposed on the second protective film 150 of each pixel area PA. The first source electrode 215 can include a conductive material. For example, the first source electrode 215 can include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first source electrode 215 can include a different material from the first gate electrode 213, but the embodiments of the present disclosure are not limited thereto. The first source electrode 215 can be electrically connected to the first source area of the first semiconductor layer 211. For example, the first insulating film 212, the second insulating film 214, the first protective film 130, the fourth insulating film 224, and the second protective film 150 can include a first contact hole that partially exposes the first source region of the first semiconductor layer 211 of the first thin film transistor 210. The first source electrode 215 can include a region that overlaps the first source region of the first semiconductor layer 211. For example, the first source electrode 215 can be in contact with the first source region of the first semiconductor layer 211 within the first source contact hole.

The first drain electrode 216 of the first thin film transistor can be disposed on the second protective film 150 of each pixel area PA. The first drain electrode 216 can include a conductive material. For example, the first drain electrode 216 can include a single layer or multiple layers including one of aluminum (Al), chromium (Cr), copper (Cu), titanium (Ti), molybdenum (Mo), and tungsten (W), or an alloy thereof, but the embodiments of the present disclosure are not limited thereto. The first drain electrode 216 can include a different material from the first gate electrode 213, but the embodiments of the present disclosure are not limited thereto. For example, the first drain electrode 216 can include the same material as the first source electrode 215, but the embodiments of the present disclosure are not limited thereto. The first drain electrode 216 and the first source electrode 215 can be formed through the same process, but the embodiments of the present disclosure are not limited thereto. The first drain electrode 216 can be electrically connected to the first drain region of the first semiconductor layer 211. The first drain electrode 216 can be spaced apart from the first source electrode 215. For example, the first insulating film 212, the second insulating film 214, the first protective film 130, the fourth insulating film 224, and the second protective film 150 can include a first contact hole that partially exposes the first drain region of the first semiconductor layer 211. The first drain electrode 216 can include a region overlapping the first drain region of the first semiconductor layer 211. For example, the first drain electrode 216 can be in contact with the first drain region of the first semiconductor layer 211 within the first contact hole.

The light emitting element 600 of each pixel area PA can be disposed on the transistors of each pixel area PA. For example, the first thin film transistor 210 and the second thin film transistor 220 of each pixel area PA can be disposed between the substrate 105 and the first electrode 610 of each pixel area PA. Accordingly, in the display apparatus according to the embodiment of the present disclosure, the area occupied by each pixel area PA can be minimized. Therefore, the resolution of the display apparatus according to the embodiment of the present disclosure can be improved.

A first planarization layer 160 and a second planarization layer 170 can be disposed between the driving circuit and the light emitting element 600 of each pixel area PA. For example, the first electrode 610, the emission layer 620, and the second electrode 630 of each pixel area PA can be disposed on the second planarization layer 170 of each pixel area PA. The first planarization layer 160 and the second planarization layer 170 can reduce or eliminate steps caused by the transistors. For example, the upper surface of the second planarization layer 170 facing the light emitting element 600 of each pixel area PA can be a flat surface. The first planarization layer 160 and the second planarization layer 170 can include an insulating material. For example, the first planarization layer 160 and the second planarization layer 170 can include an organic insulating material, but the embodiments of the present disclosure are not limited thereto. The second planarization layer 170 can include a material different from the first planarization layer 160. Accordingly, in the display apparatus according to the embodiment of the present disclosure, steps caused by the transistors can be effectively reduced or eliminated. For another example, one of the first planarization layer 160 and the second planarization layer 170 can be omitted.

An intermediate electrode 510 can be disposed between the first planarization layer 160 and the second planarization layer 170 of each pixel area PA. The light emitting element 600 can be electrically connected to the first drain electrode 216 of the first thin film transistor 210 through the intermediate electrode 510. For example, the intermediate electrode 510 can penetrate the first planarization layer 160 and be connected to the first drain electrode 216, and the first electrode 610 of the light emitting element 600 can penetrate the second planarization layer 170 and be connected to the intermediate electrode 510. The intermediate electrode 510 can include a region overlapping the first drain electrode 216 and a region overlapping the first electrode 610. For example, the intermediate electrode 510 can be disposed between the first drain electrode 216 and the first electrode 610. The intermediate electrode 510 can be in contact with the first drain electrode 216. For example, the intermediate electrode 510 can be in direct contact with the first drain electrode 216. The first electrode 610 can be in contact with the intermediate electrode 510. For example, the first electrode 610 can be in direct contact with the intermediate electrode 510. The intermediate electrode 510 can include a conductive material. For example, the intermediate electrode 510 can include a metal such as aluminum (Al), chromium (Cr), copper (Cu), titanium (Ti), molybdenum (Mo), and tungsten (W), but the embodiments of the present disclosure are not limited thereto. The intermediate electrode 510 can include a different material from the first drain electrode 216 and the first electrode 610, but the embodiments of the present disclosure are not limited thereto.

A bank 180 can be arranged on the second planarization layer 170 of each pixel area PA. The bank 180 can include an insulating material. For example, the bank 180 can be formed of a material including a black pigment or the like, or an organic material such as a benzocyclobutene resin, a polyimide resin, an acrylic resin, or a photosensitive polymer, but the embodiments of the present disclosure are not limited thereto. When the bank 180 is formed of a material including a black pigment or a black dye, the bank 180 can be a black bank. When the bank 180 is formed of a material including a black pigment or a black dye, light from the outside can be blocked, and the brightness of the display apparatus can be further improved. The bank 180 can include a material different from the first planarization layer 160 and the second planarization layer 170. The bank 180 can cover the edge of the first electrode 610. The emission layer 620 and the second electrode 630 of each pixel area PA can be disposed on a portion of the first electrode 610 exposed by the bank 180. For example, the bank 180 can define an emission area within each pixel area PA.

A spacer 181 can be disposed on the bank 180 of each pixel area PA. The spacer 181 can be formed with a width narrower than the width of the bank 180. The spacer 181 can include an insulating material. For example, the spacer 181 can include an organic insulating material, but the embodiments of the present disclosure are not limited thereto. The spacer 181 can be formed of the same material as the bank 180, but the embodiments of the present disclosure are not limited thereto. The spacer 181 can prevent damage to the emission material layer 622 formed on the bank 180 and an adjacent pixel area PA due to a fine metal mask.

The emission layer 620 of each pixel area PA can extend over the bank 180 and the spacer 181. Each pixel area PA can exhibit a different color from the color of an adjacent pixel area PA. For example, the emission material layer 622 of each pixel area PA can be separated from the emission material layer 622 of an adjacent pixel area PA. The emission material layer 622 of each pixel area PA can include end portions positioned within each pixel area PA. The emission material layer 622 can be formed using a fine metal mask FMM. The end portions of each emission material layer 622 can be disposed on the bank 180 and the spacer 181. The first common layer 621 and the second common layer 623 of each emission layer 620 can extend along the surface of the bank 180. For example, the first common layer 621 and the second common layer 623 of each pixel area PA can be connected to the first common layer 621 and the second common layer 623 of an adjacent pixel area PA. Accordingly, the process efficiency of the display apparatus according to the embodiment of the present disclosure can be improved.

A voltage supplied to the second electrode 630 of each pixel area PA can be the same as the voltage supplied to the second electrode 630 of an adjacent pixel area PA. For example, the second electrode 630 of each pixel area PA can be connected to the second electrode 630 of a pixel area PA adjacent to the bank 180. Accordingly, the display apparatus according to the embodiment of the present disclosure can control the brightness of each pixel area PA through a gate signal and a data signal applied to each pixel area PA. The second electrode 630 of each pixel area PA can be in contact with the second electrode 630 of an adjacent pixel area PA.

An encapsulation member 700 can be arranged on the light emitting element 600 of each pixel area PA. The encapsulation member 700 can prevent damage to the light emitting element 600 due to external impact and moisture. The encapsulation member 700 can have a multilayer structure, but the embodiments of the present disclosure are not limited thereto. For example, the encapsulation member 700 can include a first encapsulation layer 710, a second encapsulation layer 720, and a third encapsulation layer 730, but the embodiments of the present disclosure are not limited thereto. The first encapsulation layer 710, the second encapsulation layer 720, and the third encapsulation layer 730 can include an insulating material. The second encapsulation layer 720 can include a different material from the first encapsulation layer 710 and the third encapsulation layer 730, but the embodiments of the present disclosure are not limited thereto. For example, the first encapsulation layer 710 and the third encapsulation layer 730 can include an inorganic insulating material, and the second encapsulation layer 720 can include an organic insulating material. Accordingly, in the display apparatus according to the embodiment of the present disclosure, damage to the light emitting elements 600 due to external impact and moisture can be effectively prevented. Steps caused by the light emitting element 600 of each pixel area PA can be removed by the encapsulation member 700. For example, the upper surface of the encapsulation member 700 facing the substrate 105 can be a flat plane.

A touch part can be arranged on the encapsulation member 700. The touch part can detect a touch of a user and/or a tool. For example, the touch part can include touch electrodes 811 and 822 and bridge electrodes 812. The touch electrodes 811 and 822 can be arranged side by side. The bridge electrodes 812 can connect the touch electrodes 811. The touch electrodes 811 and 822 and the bridge electrodes 812 can include a conductive material. For example, the touch electrodes 811 and 822 and the bridge electrodes 812 can include a single layer or double layer including one of aluminum (Al), chromium (Cr), copper (Cu), titanium (Ti), molybdenum (Mo), and tungsten (W), or an alloy thereof, but the embodiments of the present disclosure are not limited thereto. The touch electrodes 811 and 822 and the bridge electrodes 812 can overlap the display area of the substrate 105. The light emitting element 600 of each pixel area PA can be disposed outside the touch electrodes 811 and 822 and the bridge electrodes 812. For example, the touch electrodes 811 and 822 and the bridge electrodes 812 can overlap the bank 180. The touch electrodes 811 and 822 and the bridge electrodes 812 can be spaced apart from the light emitting element 600 of each pixel area PA. Accordingly, in the display apparatus according to the embodiment of the present disclosure, light emitted from each light emitting element 600 in a direction perpendicular to the upper surface of the substrate 105 may not be blocked by the touch electrodes 811 and 822 and the bridge electrode 812. Therefore, in the display apparatus according to the embodiment of the present disclosure, a decrease in the brightness of each pixel area PA due to the touch electrodes 811 and 821 and the bridge electrodes 822 can be prevented.

An insulating film 830 can be disposed between the bridge electrodes 812 and the touch electrodes 811 and 822. The insulating film 830 can include an insulating material. For example, the insulating film 830 can include a material such as silicon oxide (SiOx) and silicon nitride (SiNx), but the embodiments of the present disclosure are not limited thereto. The second touch electrodes 822 can be disposed on the same layer as the first touch electrodes 811, but the embodiments of the present disclosure are not limited thereto. For example, the touch electrodes 811 and 822 and the bridge electrodes connecting the touch electrodes 822 can be disposed on the insulating film 830 covering the bridge electrodes 812. The insulating film 830 can include touch contact holes that partially expose the bridge electrodes 812. The touch electrode 811 can be connected to the bridge electrode 812 corresponding thereto through one of the touch contact holes.

A buffer film 800 can be disposed between the encapsulation member 700 and the touch part 811, 812, and 822. The buffer film 800 can prevent damage to the encapsulation member 700 and the light emitting elements 600 due to the forming process of the touch electrodes 811 and 822 and the bridge electrodes 812. The buffer film 800 can include an insulating material. For example, the buffer film 800 can include a material such as silicon oxide (SiOx) and silicon nitride (SiNx), but the embodiments of the present disclosure are not limited thereto.

An insulating film 890 can be disposed on the touch part 811, 812, and 822. The insulating film 890 can prevent damage to the touch part 811, 812, and 822 due to external impact and moisture.

Figure 4:
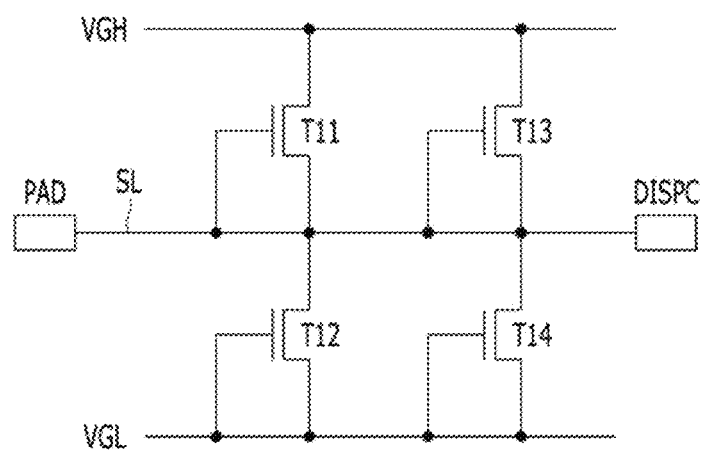
FIG. 4 is a circuit diagram of an electrostatic discharge circuit of a display apparatus according to a comparative embodiment of the present disclosure.

FIG. 4 is a diagram showing an electrostatic discharge circuit of a display apparatus according to an embodiment of the present disclosure.

Referring to FIG. 4, a signal line SL connects a pad PAD and a display circuit DISPC, and the electrostatic discharge circuit can be connected to the signal line SL. For example, the signal line SL can be a gate control line GL, the pad PAD can be a gate pad, and the display circuit DISPC can be pixels P, but the embodiments of the present disclosure are not limited thereto.

As another example, the signal line SL can be a data line DL, the pad PAD can be a data pad, and the display circuit DISPC can be pixels P. A signal within a range of a first gate power voltage VGH to a second gate power voltage VGL can be applied to the signal line SL. In other words, the first gate power voltage VGH and the second gate power voltage VGL can be determined by the voltage range of the signal applied to the signal line SL.

The electrostatic discharge circuit can include first to fourth transistors T11 to T14.

The first electrode of the first transistor T11 can be electrically connected to a first gate power voltage (VGH) line, the second electrode of the first transistor T11 can be electrically connected to the signal line SL, and the gate electrode of the first transistor T11 can be electrically connected to the signal line SL. For example, the first transistor T11 can be connected between the first gate power voltage (VGH) line and the signal line SL.

The first electrode of the second transistor T12 can be electrically connected to the signal line SL, the second electrode of the second transistor T12 can be electrically connected to a second gate power voltage (VGL) line, and the gate electrode of the second transistor T12 can be electrically connected to the second gate power voltage (VGL) line. For example, the second transistor T12 can be connected between the second gate power voltage (VGL) line and the signal line SL.

The first electrode of the third transistor T13 can be electrically connected to the first gate power voltage (VGH) line, the second electrode of the third transistor T13 can be electrically connected to the signal line SL, and the gate electrode of the third transistor T13 can be electrically connected to the signal line SL. For example, the third transistor T13 can be connected between the first gate power voltage (VGH) line and the signal line SL.

The first electrode of the fourth transistor T14 can be electrically connected to the signal line SL, the second electrode of the fourth transistor T14 can be electrically connected to the second gate power voltage (VGL) line, and the gate electrode of the fourth transistor T14 can be electrically connected to the second gate power voltage (VGL) line. For example, the second transistor T12 can be connected between the second gate power voltage (VGL) line and the signal line SL.

When a voltage higher than the first gate power voltage VGH is applied to the signal line SL due to static electricity, the first transistor T11 and the third transistor T13 can be turned on. For example, the first transistor T11 can be turned on in response to a voltage difference between the gate electrode and the first electrode of the first transistor T11, and the third transistor T13 can be turned on in response to a voltage difference between the gate electrode and the first electrode of the third transistor T13. In this case, the current due to the static electricity can flow from the signal line SL to the first gate power voltage (VGH) line, and the voltage at the signal line SL can be reduced. For example, the first transistor T11 and the third transistor T13 can drop a voltage higher than the first gate power voltage VGH, but the embodiments of the present disclosure are not limited thereto.

When a voltage lower than the second gate power voltage VGL is applied to the signal line SL due to static electricity, the second transistor T12 and the fourth transistor T14 can be turned on. For example, the second transistor T12 can be turned on in response to a voltage difference between the gate electrode and the first electrode of the second transistor T12, and the fourth transistor T14 can be turned on in response to a voltage difference between the gate electrode and the first electrode of the fourth transistor T14. In this case, a current due to the static electricity flows from the second gate power voltage (VGL) line to the signal line SL, and the voltage at the signal line SL can increase. For example, the second transistor T12 and the fourth transistor T14 can increase a voltage lower than the second gate power voltage VGL, but the embodiments of the present disclosure are not limited thereto.

The voltage at the signal line SL is maintained between the first gate power voltage VGH and the second gate power voltage VGL by the first transistor T11 to the fourth transistor T14, and the display circuit DISPC can be protected from static electricity.

Figure 5:
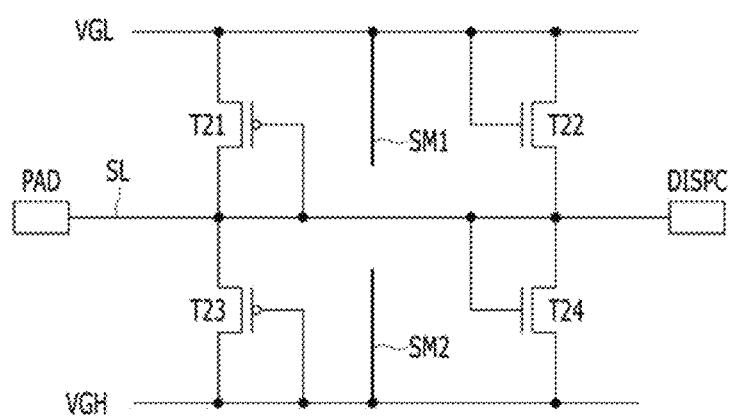
FIG. 5 is a circuit diagram of an electrostatic discharge circuit of a display apparatus according to an embodiment of the present disclosure.

FIG. 5 is a circuit diagram of an electrostatic discharge circuit of a display apparatus according to another embodiment of the present disclosure.

As shown in FIG. 5, a signal line SL connects a pad PAD and a display circuit DISPC, and the electrostatic discharge circuit ESD can be connected to the signal line SL. For example, the signal line SL can be a gate control line GL, the pad PAD can be a gate pad, and the display circuit DISPC can be pixels P, but the embodiments of the present disclosure are not limited thereto.

As another example, the signal line SL can be a data line DL, the pad PAD can be a data pad, and the display circuit DISPC can be pixels P. A signal within the range of the first gate power voltage VGH to the second gate power voltage VGL can be applied to the signal line SL. In other words, the first gate power voltage VGH and the second gate power voltage VGL can be determined by the voltage range of the signal applied to the signal line SL.

The electrostatic discharge circuit of the display apparatus according to an embodiment of the present disclosure can include first to fourth transistors T21 to T24.

The first transistor T21 and the third transistor T23 can be polysilicon or low temperate polysilicon (LTPS) transistors, and the second transistor T22 and the fourth transistor T24 can be oxide transistors, but the embodiments of the present disclosure are not limited thereto. For example, one of the first transistor T21 to the fourth transistor T24 can be configured as one or a combination of a polysilicon transistor, a low temperate polysilicon transistor, and an oxide transistor.

The first transistor T21 and the third transistor T23 can be PMOS transistors, and the second transistor T22 and the fourth transistor T24 can be NMOS transistors, but the embodiments of the present disclosure are not limited thereto. For example, one of the first transistor T21 to the fourth transistor T24 can be configured as one or a combination of a PMOS transistor and an NMOS transistor.

The first transistor T21 and the second transistor T22 can have a structure in which they are disposed to overlap each other, and the third transistor T23 and the fourth transistor T24 can have a structure in which they are disposed to overlap each other, but the embodiments of the present disclosure are not limited thereto.

The first electrode of the first transistor T21 can be electrically connected to the second gate power voltage (VGL) line, the second electrode of the first transistor T21 can be electrically connected to the signal line SL, and the gate electrode of the first transistor T21 can be electrically connected to the signal line SL. For example, the first transistor T21 can be connected between the second gate power voltage (VGL) line and the signal line SL.

The first electrode of the second transistor T22 can be electrically connected to the second gate power voltage (VGL) line, the second electrode of the second transistor T22 can be electrically connected to the signal line SL, and the gate electrode of the second transistor T22 can be electrically connected to the second gate power voltage (VGL) line. For example, the second transistor T22 can be connected between the second gate power voltage (VGL) line and the signal line SL.

The first electrode of the third transistor T23 can be electrically connected to the first gate power voltage (VGH) line, the second electrode of the third transistor T23 can be electrically connected to the signal line SL, and the gate electrode of the third transistor T23 can be electrically connected to the first gate power voltage (VGH) line. For example, the third transistor T23 can be connected between the first gate power voltage (VGH) line and the signal line SL.

The first electrode of the fourth transistor T24 can be electrically connected to the first gate power voltage (VGH) line, the second electrode of the fourth transistor T24 can be electrically connected to the signal line SL, and the gate electrode of the fourth transistor T24 can be electrically connected to the signal line SL. For example, the fourth transistor T24 can be connected between the first gate power voltage (VGH) line and the signal line SL.

A first shielding metal SM1 (first shielding metal layer) can be disposed between the first transistor T21 and the second transistor T22 which are arranged to overlap each other. A second shielding metal SM2 (second shielding metal layer) can be disposed between the third transistor T23 and the fourth transistor T24 which are arranged to overlap each other.

The first and second shielding metals SM1 and SM2 can be electrically connected to the first gate power voltage (VGH) line or the second gate power voltage (VGL) line. The first and second shielding metals SM1 and SM2 can prevent the gate signals of the first transistor T21 and the third transistor T23, which are polysilicon or LTPS transistors, from affecting the channel regions of the oxide semiconductor layers of the second transistor T22 and the fourth transistor T24, which are oxide transistors, to cause generation of on/off noise.

When a voltage higher than the first gate power voltage VGH is applied to the signal line SL due to static electricity, the third transistor T23 and the fourth transistor T24 can be turned on. For example, the third transistor T23 can be turned on in response to a voltage difference between the gate electrode and the first electrode of the third transistor T23, and the fourth transistor T24 can be turned on in response to a voltage difference between the gate electrode and the first electrode of the fourth transistor T24, but the embodiments of the present disclosure are not limited thereto. In this case, a current due to the static electricity flows from the signal line SL to the first gate power voltage (VGH) line, and the voltage at the signal line SL can be reduced. For example, the third transistor T23 and the fourth transistor T24 can drop a voltage higher than the first gate power voltage VGH, but the embodiments of the present disclosure are not limited thereto.

When a voltage lower than the second gate power voltage VGL is applied to the signal line SL due to static electricity, the first transistor T21 and the second transistor T22 can be turned on. For example, the first transistor T21 can be turned on in response to a voltage difference between the gate electrode and the first electrode of the first transistor T21, and the second transistor T22 can be turned on in response to a voltage difference between the gate electrode and the first electrode of the second transistor T22, but the embodiments of the present disclosure are not limited thereto. In this case, a current due to the static electricity flows from the second gate power voltage (VGL) line to the signal line SL, and the voltage at the signal line SL can increase. For example, the first transistor T21 and the second transistor T22 can increase a voltage lower than the second gate power voltage VGL, but the embodiments of the present disclosure are not limited thereto.

The voltage at the signal line SL is maintained between the first gate power voltage VGH and the second gate power voltage VGL by the first transistor T21 to the fourth transistor T24, and thus the display circuit DISPC can be protected from static electricity.

For example, since the electrostatic discharge circuit needs to be configured with a channel width and channel length of sufficient sizes to remove static electricity flowing in from the outside, a large area is occupied by the electrostatic discharge circuit. If the size of the electrostatic discharge circuit is minimized due to design space constraints, burnt can occur in the channel area of each transistor due to excessive electrostatic current. Defects such as moisture penetration can occur due to damage to the upper layer caused by the burnt.

According to aspects of the present disclosure, silicon transistors and oxide transistors are used together to configure the electrostatic discharge circuit, burnt occurrence in the channel areas of the transistors can be prevented and defects such as moisture penetration due to damage to upper layers caused by the burnt can be prevented or minimized.

According to aspects of the present disclosure, it is possible to provide an electrostatic discharge circuit in which a channel width can be doubled within the same area by using silicon transistors and oxide transistors together and configuring the silicon transistors and oxide transistors in an overlapping form.

Figure 6:
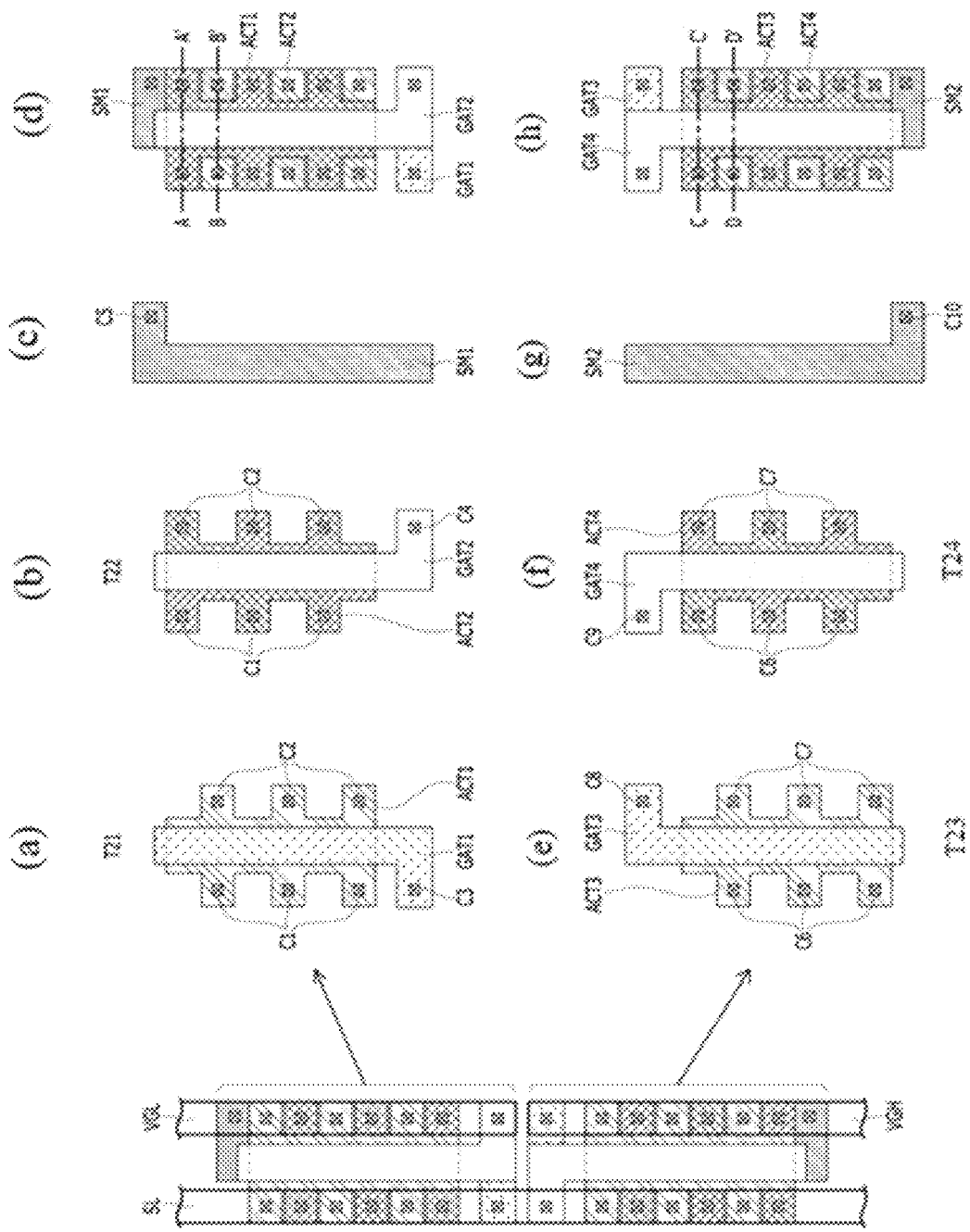
FIG. 6 illustrates diagrams showing an electrostatic discharge circuit of a display apparatus according to an embodiment of the present disclosure.

FIG. 6 is a diagram showing an electrostatic discharge circuit of a display apparatus according to an embodiment of the present disclosure.

As illustrated in (a) to (h) of FIG. 6, a signal line SL, a first gate power voltage (VGH) line, and a second gate power voltage (VGL) line are arranged in parallel, and the first gate power voltage (VGH) line and the second gate power voltage (VGL) line can be arranged in the same direction, but the embodiments of the present disclosure are not limited thereto.

Referring to views (a) to (d) of FIG. 6, a first transistor T21, which is a polysilicon or LTPS transistor, and a second transistor T22, which is an oxide transistor, can be arranged to be stacked between the signal line SL and the second gate power voltage (VGL) line (views (a) and (b) of FIG. 6). A first shielding metal SM1 can be disposed between the first transistor T21 and the second transistor T22 (view (c) of FIG. 6).

Referring to view (a) of FIG. 6, the first transistor T21 can include a first semiconductor layer ACT1 and a first gate electrode GAT1. A predetermined region of the first semiconductor layer ACT1 which overlaps the first gate electrode GAT1 can be a first channel region. Predetermined regions of the first semiconductor layer ACT1 on both sides of the first channel region can be a first source region S1 and a first drain region D1. The specific structure will be described with reference to FIG. 7 and FIG. 8.

The first source region and the first drain region of the first semiconductor layer ACT1 and a second source region and a second drain region of a second semiconductor layer ACT2 can be formed in a concave-convex structure having a plurality of concave portions and a plurality of convex portions.

First contact holes C1 can be formed in the convex portions of the first source region of the first semiconductor layer ACT1 and the second source region of the second semiconductor layer ACT2. The first source region of the first semiconductor layer ACT1 and the second source region of the second semiconductor layer ACT2 can be electrically connected to the signal line SL through the first contact holes C1.

Second contact holes C2 can be formed in the convex portions of the first drain region of the first semiconductor layer ACT1 and the second drain region of the second semiconductor layer ACT2. The first drain region of the first semiconductor layer ACT1 and the second drain region of the second semiconductor layer ACT2 can be electrically connected to the second gate power voltage (VGL) line through the second contact holes C2.

A third contact hole C3 can be formed in the first gate electrode GAT1 of the first transistor T21, and the first gate electrode GAT1 of the first transistor T21 can be electrically connected to the signal line SL through the third contact hole C3.

Referring to view (c) of FIG. 6, a fifth contact hole C5 can be formed in the first shielding metal SM1, and the first shielding metal SM1 can be electrically connected to the second gate power voltage (VGL) line through the fifth contact hole C5.

Referring to view (b) of FIG. 6, the second transistor T22 can include a second semiconductor layer ACT2 and a second gate electrode GAT2. A predetermined region of the second semiconductor layer ACT2 which overlaps the second gate electrode GAT2 can be a second channel region. Predetermined regions of the second semiconductor layer ACT2 on both sides of the second channel region can be a second source region and a second drain region. The specific structure will be described with reference to FIG. 7 and FIG. 8.

When the first transistor T21 and the second transistor T22 are stacked, the plurality of convex portions of the first source region and the first drain region and the plurality of convex portions of the second source region and the second drain region can be disposed such that they do not overlap. For example, the plurality of convex portions of the first source region and the first drain region can be arranged to correspond to the plurality of concave portions of the second source region and the second drain region, and the plurality of concave portions of the first source region and the first drain region can be arranged to correspond to the plurality of convex portions of the second source region and the second drain region.

A fourth contact hole C4 can be formed in the second gate electrode GAT2 of the second transistor T22, and the second gate electrode GAT2 of the second transistor T22 can be electrically connected to the second gate power voltage (VGL) line through the fourth contact hole C4. The third contact hole C3 and the fourth contact hole C4 can be disposed on the same line.

The fifth contact hole C5 and the fourth contact hole C4 can be formed on both sides of the second gate power voltage (VGL) line.

Referring to views (e) to (h) of FIG. 6, a third transistor T23, which is a polysilicon or LTPS transistor, and a fourth transistor T24, which is an oxide transistor, can be arranged to be stacked between the signal line SL and the first gate power voltage (VGH) line. A second shielding metal SM2 can be disposed between the third transistor T23 and the fourth transistor T24.

Referring to view (e) of FIG. 6, the third transistor T23 can include a third semiconductor layer ACT3 and a third gate electrode GAT3. A predetermined region of the third semiconductor layer ACT3 which overlaps the third gate electrode GAT3 can be a third channel region, and predetermined regions of the third semiconductor layer ACT3 on both sides of the third channel region can be a third source region and a third drain region. The specific structure will be described with reference to FIG. 9 and FIG. 10.

Referring to view (f) of FIG. 6, the fourth transistor T24 can include a fourth semiconductor layer ACT4 and a fourth gate electrode GAT4. A predetermined region of the fourth semiconductor layer ACT4 which overlaps the fourth gate electrode GAT4 can be a fourth channel region. Predetermined regions of the fourth semiconductor layer ACT4 on both sides of the fourth channel region can be a fourth source region and a fourth drain region. The specific structure will be described with reference to FIG. 9 and FIG. 10.

The third source region and the third drain region of the third semiconductor layer ACT3 and the fourth source region and the fourth drain region of the fourth semiconductor layer ACT4 can be formed in a concave-convex structure having a plurality of concave portions and a plurality of convex portions.

Sixth contact holes C6 can be formed in the convex portions of the third source region of the third semiconductor layer ACT3 and the fourth source region of the fourth semiconductor layer ACT4, and the third source region of the third semiconductor layer ACT3 and the fourth source region of the fourth semiconductor layer ACT4 can be electrically connected to the signal line SL through the sixth contact holes C6.

Seventh contact holes C7 can be formed in the convex portions of the third drain region of the third semiconductor layer ACT3 and the fourth drain region of the fourth semiconductor layer ACT4, and the third drain region of the third semiconductor layer ACT3 and the fourth drain region of the fourth semiconductor layer ACT4 can be electrically connected to the first gate power voltage (VGH) line through the seventh contact holes C7.

When the third transistor T23 and the fourth transistor T24 are stacked, the plurality of convex portions of the third source region and the third drain region and the plurality of convex portions of the fourth source region and the fourth drain region can be disposed such that they do not overlap. For example, the plurality of convex portions of the fourth source region and the fourth drain region can be arranged to correspond to the plurality of concave portions of the fourth source region and the fourth drain region, and the plurality of concave portions of the third source region and the third drain region can be arranged to correspond to the plurality of convex portions of the fourth source region and the fourth drain region.

An eighth contact hole C8 can be formed in the third gate electrode GAT3 of the third transistor T23, and the third gate electrode GAT3 of the third transistor T23 can be electrically connected to the first gate power voltage (VGH) line through the eighth contact hole C8.

A ninth contact hole C9 can be formed in the fourth gate electrode GAT4 of the fourth transistor T24, and the fourth gate electrode GAT4 of the fourth transistor T24 can be electrically connected to the signal line SL through the ninth contact hole C9. The eighth contact hole C8 and the ninth contact hole C9 can be disposed on the same line.

Referring to view (g) of FIG. 6, a tenth contact hole C10 can be formed in the second shielding metal SM2, and the second shielding metal SM2 can be electrically connected to the first gate power voltage (VGH) line through the tenth contact hole C10. The eighth contact hole C8 and the tenth contact hole C10 can be formed on both sides of the first gate power voltage (VGH) line.

Figure 7:
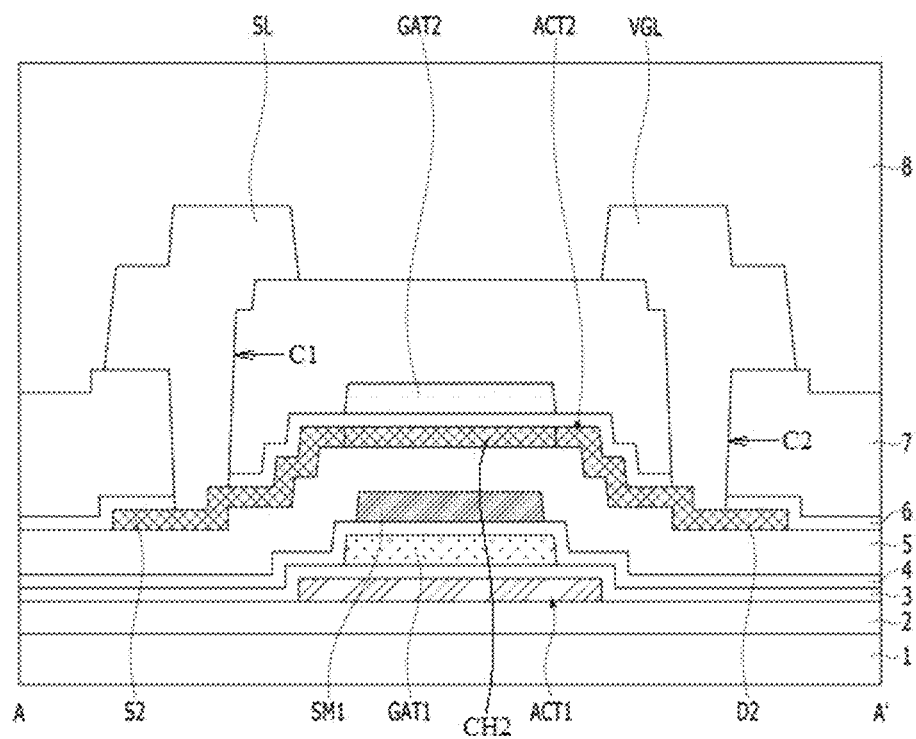
FIG. 7 is a cross-sectional view taken along line A-A' in (d) of FIG. 6.

FIG. 7 is a cross-sectional view of the electrostatic discharge circuit of the display apparatus according to an embodiment of the present disclosure. Particularly, FIG. 7 is a cross-sectional view along line A-A' in (d) of FIG. 6.

Referring to FIG. 7, a buffer layer 2 can be disposed on a substrate 1. The buffer layer 2 can include an inorganic insulating material, but the embodiments of the present disclosure are not limited thereto. The buffer layer 2 can be formed in a single-layer or multilayer structure, and can prevent moisture and the like from penetrating through the interface of the substrate 1. The buffer layer 2 can be buffer layers 111 and 112 in FIG. 3.

The first transistor T21 composed of the first semiconductor layer ACT1 and the first gate electrode GAT1 can be provided on the buffer layer 2.

The first semiconductor layer ACT1 can be disposed on the buffer layer 2. A first insulating film 3 can be disposed on the first semiconductor layer ACT1. The first gate electrode GAT1 can be disposed on the first insulating film 3.

A second insulating film 4 can be disposed on the substrate 1 on which the first transistor T21 is formed. For example, the second insulating film 4 can be formed throughout the surface of the substrate 1 on which the first transistor T21 is formed. The first shielding metal SM1 can be disposed on the second insulating film 4 above the first gate electrode GAT1. The first shielding metal SM1 can be arranged to sufficiently cover the first gate electrode GAT1. The first shielding metal SM1 can be a metal layer, but the embodiments of the present disclosure are not limited thereto.

A third insulating film 5 can be disposed on the substrate 1 on which the first shielding metal SM1 is formed. For example, the third insulating film 5 can be disposed throughout the surface of the substrate 1 on which the first shielding metal SM1 is formed. The second transistor T22 including the second semiconductor layer ACT2 and the second gate electrode GAT2 can be formed on the third insulating film 5. The second semiconductor layer ACT2 can be disposed on the third insulating film 5. The second semiconductor layer ACT2 can include the second channel region CH2 overlapping the second gate electrode GAT2, the second source region S2 and the second drain region D2 on both sides of the second channel region CH2.

A fourth insulating film 6 can be disposed on the second semiconductor layer ACT2. The second gate electrode GAT2 can be disposed on the fourth insulating film 6.

A fifth insulating film 7 can be disposed on the substrate 1 on which the second transistor T22 is formed. For example, the fifth insulating film 7 can be disposed throughout the surface of the substrate 1 on which the second transistor T22 is formed. The first contact hole C1 can be formed in the fourth insulating film 6 and the fifth insulating film 7 on the second source region S2 of the second semiconductor layer ACT2. The signal line SL can be electrically connected to the second source region S2 of the second semiconductor layer ACT2 through the first contact hole C1.

Figure 8:
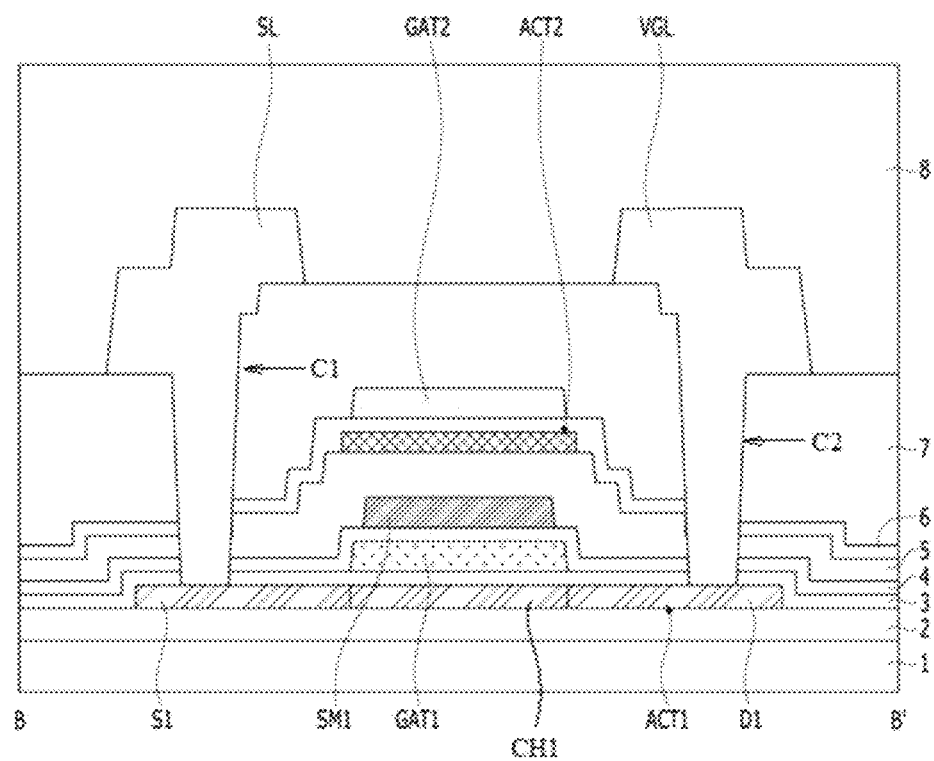
FIG. 8 is a cross-sectional view taken along line B-B' in (d) of FIG. 6.

The second contact hole C2 can be formed in the fourth insulating film 6 and the fifth insulating film 7 on the second drain region D2 of the second semiconductor layer ACT2. The second gate power voltage (VGL) line can be electrically connected to the second drain region D2 of the second semiconductor layer ACT2 through the second contact hole C2. FIG. 8 is a cross-sectional view of the electrostatic discharge circuit of the display apparatus according to an embodiment of the present disclosure. Particularly, FIG. 8 is a cross-sectional view taken along line B-B' in (d) of FIG. 6.

Referring to FIG. 8, the buffer layer 2 can be disposed on the substrate 1. The buffer layer 2 can include an inorganic insulating material, but the embodiments of the present disclosure are not limited thereto. The buffer layer 2 can be formed in a single-layer or multilayer structure and can prevent moisture and the like from penetrating through the interface of the substrate 1. The buffer layer 2 can be the buffer layers 111 and 112 in FIG. 3.

The first transistor T21 including the first semiconductor layer ACT1 and the first gate electrode GAT1 can be formed on the buffer layer 2.

The first semiconductor layer ACT1 can be disposed on the buffer layer 2. The first insulating film 3 can be disposed on the first semiconductor layer ACT1. The first gate electrode GAT1 can be disposed on the first insulating film 3.

The first semiconductor layer ACT1 can include the first channel region CH1 overlapping the first gate electrode GAT1, the first source region S1 and the first drain region D1 on both sides of the first channel region CH1.

The second insulating film 4 can be disposed on the substrate 1 on which the first transistor T21 is disposed. For example, the second insulating film 4 can be disposed throughout the surface of the substrate 1 on which the first transistor T21 is disposed. The first shielding metal SM1 can be disposed on the second insulating film 4 above the first gate electrode GAT1. The first shielding metal SM1 can be disposed on the first gate electrode GAT1. The first shielding metal SM1 can be disposed to sufficiently cover the first gate electrode GAT1. The first shielding metal SM1 can be a metal layer, but the embodiments of the present disclosure are not limited thereto.

The third insulating film 5 can be disposed on the substrate 1 on which the first shielding metal SM1 is formed. For example, the third insulating film 5 can be disposed throughout the surface of the substrate 1 on which the first shielding metal SM1 is formed. The second transistor T22 including the second semiconductor layer ACT2 and the second gate electrode GAT2 can be disposed on the third insulating film 5.

The second semiconductor layer ACT2 can be disposed on the third insulating film 5. The fourth insulating film 6 can be disposed on the second semiconductor layer ACT2. The second gate electrode GAT2 can be disposed on the fourth insulating film 6.

The fifth insulating film 7 can be disposed throughout the surface of the substrate 1 on which the second transistor T22 is formed. For example, the fifth insulating film 7 can be disposed throughout the surface of the substrate 1 on which the second transistor T22 is formed.

The first contact hole C1 can be formed in the first insulating film 3, the second insulating film 4, the third insulating film 5, the fourth insulating film 6, and the fifth insulating film 7 on the first source region S1 of the first semiconductor layer ACT1. The signal line SL can be electrically connected to the first source region S1 of the first semiconductor layer ACT1 through the first contact hole C1.

The second contact hole C2 can be formed in the first insulating film 3, the second insulating film 4, the third insulating film 5, the fourth insulating film 6, and the fifth insulating film 7 on the first drain region D1 of the first semiconductor layer ACT1. The second gate power voltage (VGL) line can be electrically connected to the first drain region D1 of the first semiconductor layer ACT1 through the second contact hole C2.

Here, the first shielding metal SM1 is provided to prevent the gate signal of the first transistor T21, which is a polysilicon or LTPS transistor, from affecting the channel region of the oxide semiconductor layer of the second transistor T22, which is an oxide transistor, to cause generation of on/off noise.

Figure 9:
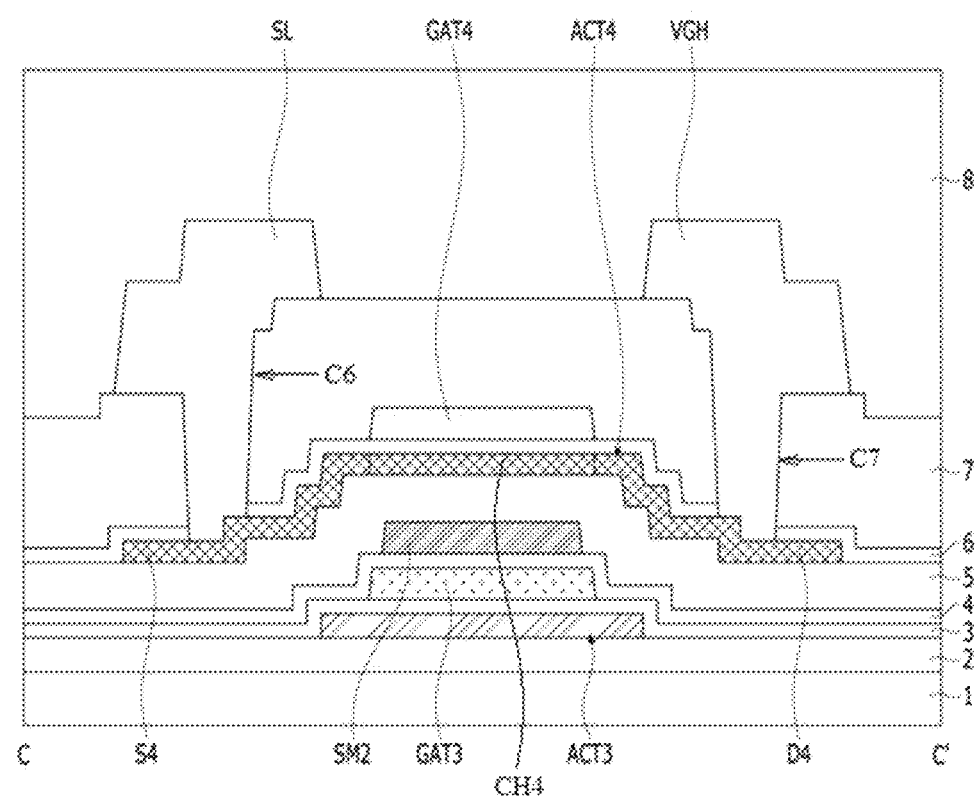
FIG. 9 is a cross-sectional view taken along line C-C' in (h) of FIG. 6.

FIG. 9 is a cross-sectional view of the electrostatic discharge circuit of the display apparatus according to an embodiment of the present disclosure. Particularly, FIG. 9 is a cross-sectional view taken along line C-C' in (h) of FIG. 6.

Referring to FIG. 9, the buffer layer 2 can be disposed on the substrate 1. The buffer layer 2 can include an inorganic insulating material, but the embodiments of the present disclosure are not limited thereto. The buffer layer 2 can be formed in a single-layer or multilayer structure, and can prevent moisture and the like from penetrating through the interface of the substrate 1. The buffer layer 2 can be the buffer layers 111 and 112 in FIG. 3.

The third transistor T23 including the third semiconductor layer ACT3 and the third gate electrode GAT3 can be disposed on the buffer layer 2.

The third semiconductor layer ACT3 can be disposed on the buffer layer 2. The first insulating film 3 can be disposed on the third semiconductor layer ACT3. The third gate electrode GAT3 can be disposed on the first insulating film 3.

The second insulating film 4 can be disposed on the substrate 1 on which the third transistor T23 is formed. For example, the second insulating film 4 can be disposed throughout the surface of the substrate 1 on which the third transistor T23 is formed. The second shielding metal SM2 can be disposed on the second insulating film 4 above the third gate electrode GAT3. The second shielding layer SM2 can be disposed to sufficiently cover the third gate electrode GAT3. The second shielding metal SM2 can be a metal layer, but the embodiments of the present disclosure are not limited thereto.

The third insulating film 5 can be disposed on the substrate 1 on which the second shielding layer SM2 is formed. For example, the third insulating film 5 can be disposed throughout the surface of the substrate 1 on which the second shielding metal SM2 is formed. The fourth transistor T24 including the fourth semiconductor layer ACT4 and the fourth gate electrode GAT4 can be formed on the third insulating film 5.

The fourth insulating film 6 can be disposed on the fourth semiconductor layer ACT4. The fourth gate electrode GAT4 can be disposed on the fourth insulating film 6.

The fourth semiconductor layer ACT4 can include the fourth channel region CH4 overlapping with the fourth gate electrode GAT2, the fourth source region S4 and the fourth drain region D4 on both sides of the fourth channel region CH4.

The fifth insulating film 7 can be disposed on the substrate 1 on which the fourth transistor T24 is formed. For example, the fifth insulating film 7 can be disposed throughout the surface of the substrate 1 on which the fourth transistor T24 is formed. The sixth contact hole C6 can be formed in the fourth insulating film 6 and the fifth insulating film 7 on the fourth source region S4 of the fourth semiconductor layer ACT4. The signal line SL can be electrically connected to the sixth source region S6 of the sixth semiconductor layer ACT6 through the sixth contact hole C6.

The seventh contact hole C7 can be formed in the fourth insulating film 6 and the fifth insulating film 7 on the fourth drain region D4 of the fourth semiconductor layer ACT4. The first gate power voltage (VGH) line can be electrically connected to the fourth drain region D4 of the fourth semiconductor layer ACT4 through the seventh contact hole C7.

Figure 10:
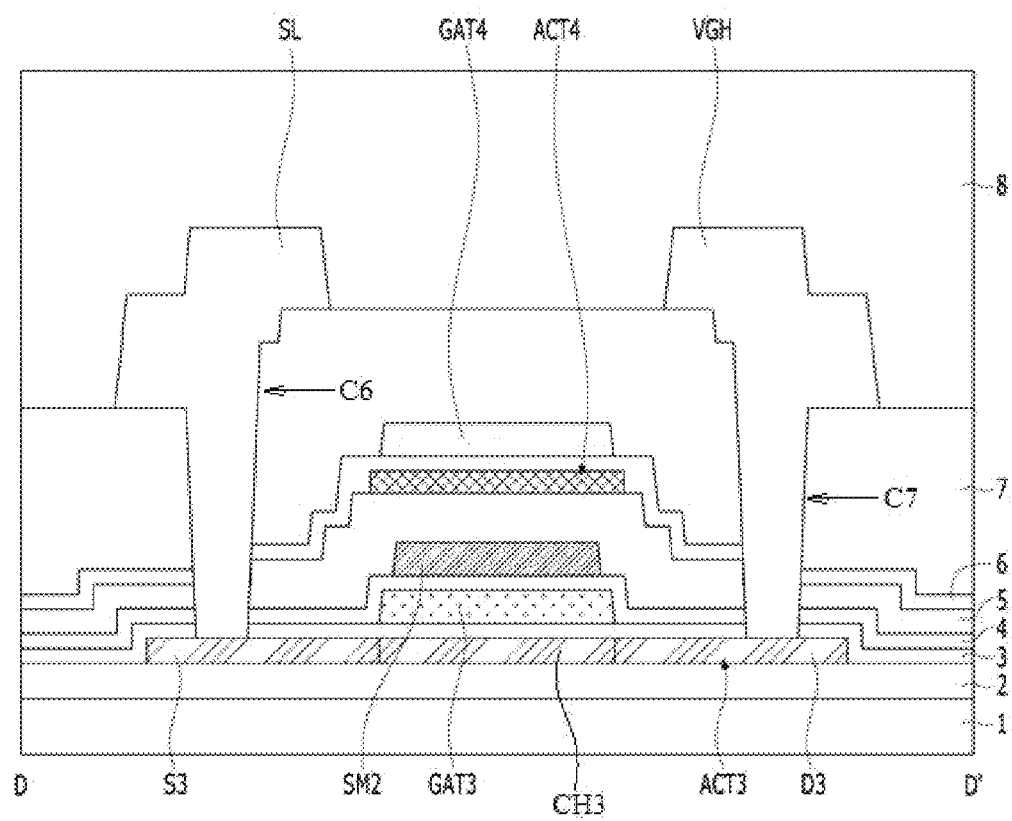
FIG. 10 is a cross-sectional view taken along line D-D' in (h) of FIG. 6.

FIG. 10 is a cross-sectional view of the electrostatic discharge circuit of the display apparatus according to an embodiment of the present disclosure. Particularly, FIG. 10 is a cross-sectional view taken along line D-D' in (h) of FIG. 6.

Referring to FIG. 10, the buffer layer 2 can be arranged on the substrate 1. The buffer layer 2 can include an inorganic insulating material, but the embodiments of the present disclosure are not limited thereto. The buffer layer 2 can be formed in a single-layer or multilayer structure and can prevent moisture and the like from penetrating through the interface of the substrate 1. The buffer layer 2 can be the buffer layers 111 and 112 in FIG. 3.

The third transistor T23 including the third semiconductor layer ACT3 and the third gate electrode GAT3 can be formed on the buffer layer 2.

The third semiconductor layer ACT3 can be disposed on the buffer layer 2. The first insulating film 3 can be disposed on the third semiconductor layer ACT3. The third gate electrode GAT3 can be disposed on the first insulating film 3.

The third semiconductor layer ACT3 can include the third channel region CH1 overlapping the third gate electrode GAT3, the third source region S3 and the third drain region D3 on both sides of the third channel region CH3.

The second insulating film 4 can be disposed on the substrate 1 on which the third transistor T23 is formed. For example, the second insulating film 4 can be disposed throughout the surface of the substrate 1 on which the third transistor T23 is formed. The second shielding metal SM2 can be disposed on the second insulating film 4 above the third gate electrode GAT3. The second shielding metal SM2 can be disposed to sufficiently cover the third gate electrode GAT3. The second shielding metal SM2 can be a metal layer, but the embodiments of the present disclosure are not limited thereto.

The third insulating film 5 can be disposed on the substrate 1 on which the second shielding metal SM2 is formed. For example, the third insulating film 5 can be disposed throughout the surface of the substrate 1 on which the second shielding metal SM2 is formed. The fourth transistor T24 including the fourth semiconductor layer ACT4 and the fourth gate electrode GAT4 can be formed on the third insulating film 5.

The fourth semiconductor layer ACT4 can be formed on the third insulating film 5. The fourth insulating film 6 can be formed on the fourth semiconductor layer ACT4. The fourth gate electrode GAT4 can be formed on the fourth insulating film 6.

The fifth insulating film 7 can be formed on the substrate 1 on which the fourth transistor T24 is formed. For example, the fifth insulating film 7 can be formed throughout the surface of the substrate 1 on which the fourth transistor T24 is formed.

The sixth contact hole C6 can be formed in the first insulating film 3, the second insulating film 4, the third insulating film 5, the fourth insulating film 6, and the fifth insulating film 7 on the third source region S3 of the third semiconductor layer ACT3. The signal line SL can be electrically connected to the third source region S3 of the third semiconductor layer ACT3 through the sixth contact hole C6.

The seventh contact hole C7 can be formed in the first insulating film 3, the second insulating film 4, the third insulating film 5, the fourth insulating film 6, and the fifth insulating film 7 on the third drain region D3 of the third semiconductor layer ACT1. The first gate power voltage (VGH) line can be electrically connected to the third drain region D3 of the third semiconductor layer ACT1 through the seventh contact hole C7.

The second shielding metal SM2 can prevent the gate signal of the third transistor T23, which is a polysilicon or LTPS transistor, from affecting the channel region of the oxide semiconductor layer of the fourth transistor T24, which is an oxide transistor, to cause generation of on/off noise.

Although FIG. 7 to FIG. 10 illustrate an example in which the second transistor T22, which is an oxide transistor, is arranged on the first transistor T21, which is a polysilicon or LTPS transistor, and the fourth transistor T24, which is an oxide transistor, is arranged on the third transistor T23, which is a polysilicon or LTPS transistor, the embodiments of the present disclosure are not limited thereto. For example, the first transistor T21, which is a polysilicon or LTPS transistor, can be arranged on the second transistor T22, which is an oxide transistor, and the third transistor T23, which is a polysilicon or LTPS transistor, can be arranged on the fourth transistor T24, which is an oxide transistor.

FIG. 11 to FIG. 14 are diagrams showing electrostatic discharge circuits according to various embodiments of the present disclosure.

Figure 11:
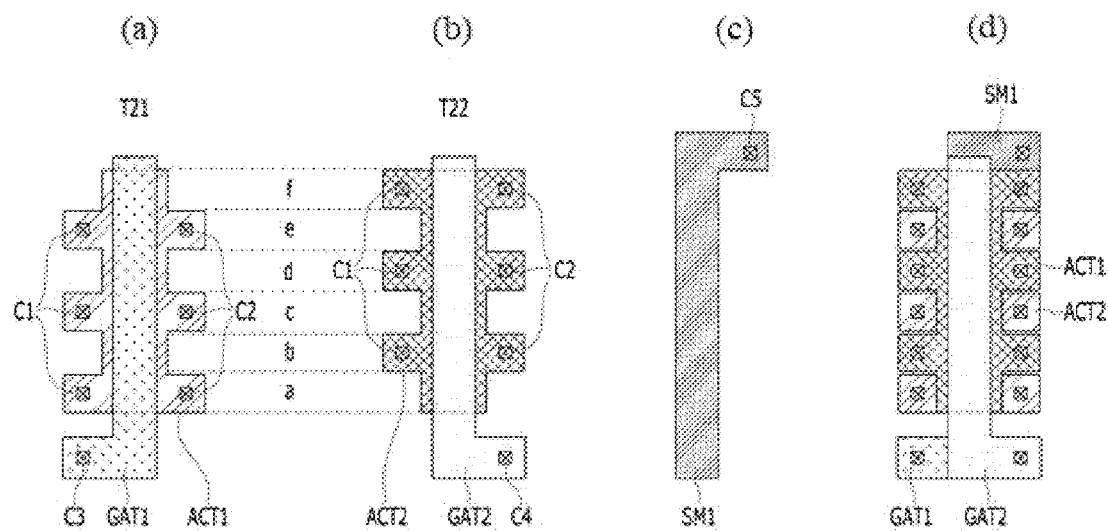
FIG. 11 to FIG. 14 are diagrams showing electrostatic discharge circuits according to various embodiments of the present disclosure.

As illustrated in (a) to (d) of FIG. 11, the first semiconductor layer ACT1 of the first transistor T21 and the second semiconductor layer ACT2 of the second transistor T22 can include a plurality of regions a, b, c, d, e, and f in the longitudinal direction of the first gate electrode GAT1 and the second gate electrode GAT2. The regions a, b, c, d, e, and f can have the same width, but the embodiments of the present disclosure are not limited thereto.

The first semiconductor layer ACT1 of the first transistor T21 can have convex portions in the first region a, the third region c, and the fifth region e on both sides of the first gate electrode GAT1, and can have concave portions in the second region b, the fourth region d, and the sixth region f on both sides of the first gate electrode GAT1, but the embodiments of the present disclosure are not limited thereto.

The first semiconductor layer ACT1 of the first transistor T21 can have the first source region in the convex portions of the first region a, the third region c, and the fifth region e on one side of the first gate electrode GAT1 and can have the first drain region in the convex portions of the first region a, the third region c, and the fifth region e on the other side of the first gate electrode GAT1.

The second semiconductor layer ACT2 of the second transistor T22 can have concave portions in the first region a, the third region c, and the fifth region e on both sides of the second gate electrode GAT2 and can have convex portions in the second region b, the fourth region d, and the sixth region f on both sides of the second gate electrode GAT2.

The second semiconductor layer ACT2 of the second transistor T22 can have the second source region in the convex portions of the second region b, the fourth region d, and the sixth region f on one side of the second gate electrode GAT2 and can have the second drain region in the convex portions of the second region b, the fourth region d, and the sixth region f on the other side of the second gate electrode GAT2.

The first contact hole C1 can be formed in each of the convex portions of the first source region of the first semiconductor layer ACT1 and the second source region of the second semiconductor layer ACT2, and the first source region of the first semiconductor layer ACT1 and the second source region of the second semiconductor layer ACT2 can be electrically connected to the signal line SL through the first contact holes C1.

The second contact hole C2 can formed in each of the convex portions of the first drain region of the first semiconductor layer ACT1 and the second drain region of the second semiconductor layer ACT2, and the first drain region of the first semiconductor layer ACT1 and the second drain region of the second semiconductor layer ACT2 can be electrically connected to the second gate power voltage (VGL) line through the second contact holes C2.

When the first transistor T21 and the second transistor T22 are stacked, the first source region and the first drain region and the second source region and the second drain region can be disposed such that they do not overlap.

Figure 12:
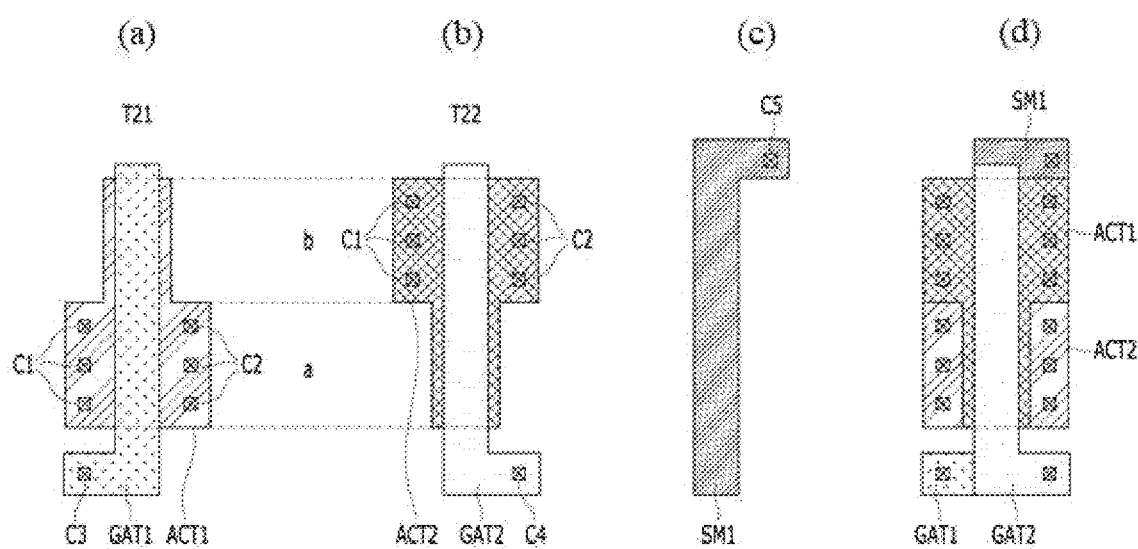

As illustrated in (a) to (d) of FIG. 12, the first semiconductor layer ACT1 of the first transistor T21 and the second semiconductor layer ACT2 of the second transistor T22 can include a plurality of regions a and b in the longitudinal direction of the first gate electrode GAT1 and the second gate electrode GAT2. The regions a and b can have the same width, but the embodiments of the present disclosure are not limited thereto.

The first semiconductor layer ACT1 of the first transistor T21 can have convex portions in the first regions a on both sides of the first gate electrode GAT1 and can have concave portions in the second regions b on both sides of the first gate electrode GAT1.

The first semiconductor layer ACT1 of the first transistor T21 can have the first source region in the convex portion of the first region a on one side of the first gate electrode GAT1 and can have the first drain region in the convex portion of the first region a on the other side of the first gate electrode GAT1.

The second semiconductor layer ACT2 of the second transistor T22 can have concave portions in the first regions a on both sides of the second gate electrode GAT2 can have convex portions in the second regions b on both sides of the second gate electrode GAT2.

The second semiconductor layer ACT2 of the second transistor T22 can have the second source region in the convex portion of the second region b on one side of the second gate electrode GAT2 can have the second drain region in the convex portion of the second region b on the other side of the second gate electrode GAT2.

The first contact hole C1 can be formed in each of the convex portions of the first source region of the first semiconductor layer ACT1 and the second source region of the second semiconductor layer ACT2, and the first source region of the first semiconductor layer ACT1 and the second source region of the second semiconductor layer ACT2 can be electrically connected to the signal line SL through the first contact holes C1.

The second contact hole C2 can be formed in each of the convex portions of the first drain region of the first semiconductor layer ACT1 and the second drain region of the second semiconductor layer ACT2, and the first drain region of the first semiconductor layer ACT1 and the second drain region of the second semiconductor layer ACT2 can be electrically connected to the second gate power voltage (VGL) line through the second contact holes C2.

When the first transistor T21 and the second transistor T22 are stacked, the first source region and the first drain region and the second source region and the second drain region can be disposed such that they do not overlap.

Figure 13:
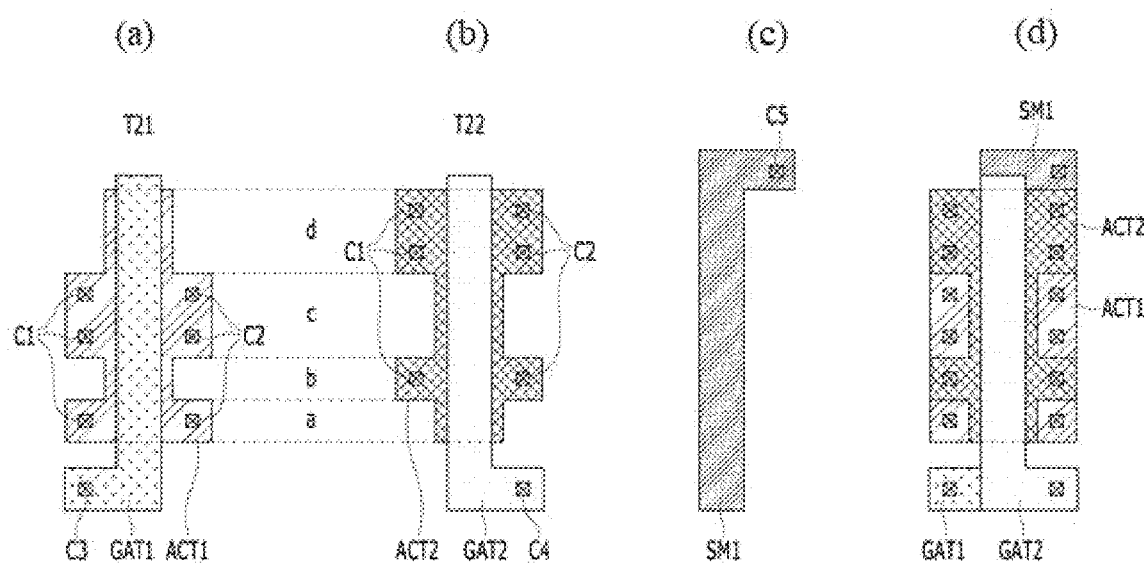

As illustrated in (a) to (d) of FIG. 13, the first semiconductor layer ACT1 of the first transistor T21 and the second semiconductor layer ACT2 of the second transistor T22 can include a plurality of regions a, b, c and d in the longitudinal direction of the first gate electrode GAT1 and the second gate electrode GAT2. The first and second regions a and b of the first semiconductor layer ACT1 of the first transistor T21 can have the same width, but the embodiments of the present disclosure are not limited thereto. The third and fourth regions c and d of the first semiconductor layer ACT1 of the first transistor T21 can have the same width, but the embodiments of the present disclosure are not limited thereto. The width of the third and fourth regions c and d of the first semiconductor layer ACT1 of the first transistor T21 can be about twice the width of the first and second regions a and b, but the embodiments of the present disclosure are not limited thereto.

The first semiconductor layer ACT1 of the first transistor T21 can have convex portions in the first region a and the third region c on both sides of the first gate electrode GAT1 and can have concave portions in the second region b and the fourth region d on both sides of the first gate electrode GAT1.

The first semiconductor layer ACT1 of the first transistor T21 can have the first source region in the convex portions of the first region a and the third region c on one side of the first gate electrode GAT1 and can have the first drain region in the convex portions of the first region a and the third region c on the other side of the first gate electrode GAT1.

The second semiconductor layer ACT2 of the second transistor T22 can have concave portions in the first region a and the third region c on both sides of the second gate electrode GAT2 and can have convex portions in the second region b and the fourth region d on both sides of the second gate electrode GAT2.

The second semiconductor layer ACT2 of the second transistor T22 can have the second source region in the convex portions of the second region b and the fourth region d on one side of the second gate electrode GAT2 and can have the second drain region in the convex portions of the second region b and the fourth region d on the other side of the second gate electrode GAT2.

The first contact holes C1 can be formed in the first source region of the first semiconductor layer ACT1 and the second source region of the second semiconductor layer ACT2, and the first source region of the first semiconductor layer ACT1 and the second source region of the second semiconductor layer ACT2 can be electrically connected to the signal line SL through the first contact holes C1.

The second contact holes C2 can be formed in the first drain region of the first semiconductor layer ACT1 and the second drain region of the second semiconductor layer ACT2, and the first drain region of the first semiconductor layer ACT1 and the second drain region of the second semiconductor layer ACT2 can be electrically connected to the second gate power voltage (VGL) line through the second contact holes C2.

When the first transistor T21 and the second transistor T22 are stacked, the first source region and the first drain region and the second source region and the second drain region can be disposed such that they do not overlap.

Figure 14:
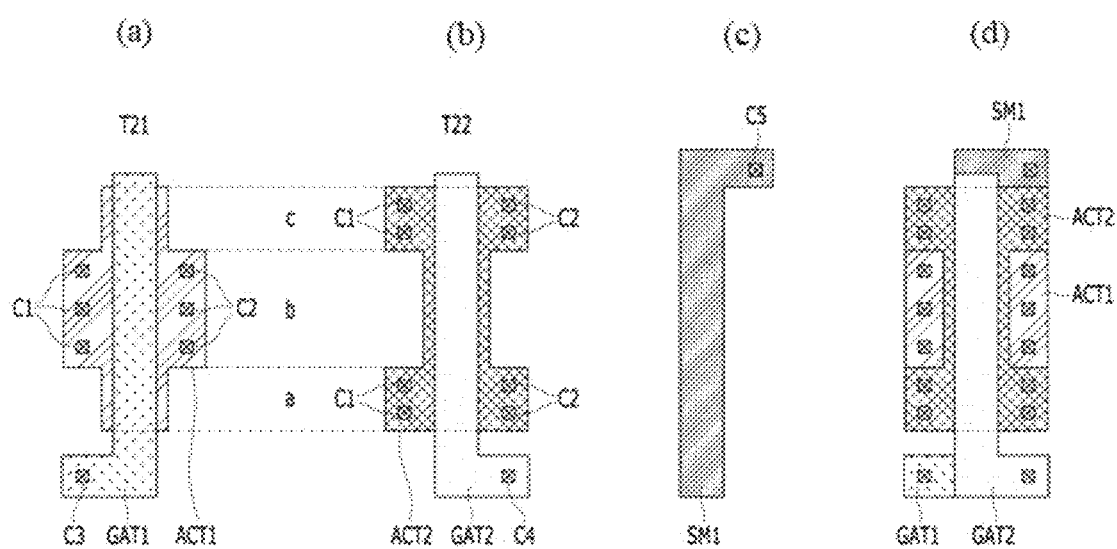

As illustrated in (a) to (d) of FIG. 14, the first semiconductor layer ACT1 of the first transistor T21 and the second semiconductor layer ACT2 of the second transistor T22 can include a plurality of regions a, b, and c in the longitudinal direction of the first gate electrode GAT1 and the second gate electrode GAT2. The first and third regions a and c of the first semiconductor layer ACT1 of the first transistor T21 can have the same width, but the embodiments of the present disclosure are not limited thereto. The width of the second region b of the first semiconductor layer ACT1 of the first transistor T21 can be about twice the width of the first and third regions a and c, but the embodiments of the present disclosure are not limited thereto.

The first semiconductor layer ACT1 of the first transistor T21 can have convex portions in the second regions b on both sides of the first gate electrode GAT1 and can have concave portions in the first region a and the third region c on both sides of the first gate electrode GAT1.

The first semiconductor layer ACT1 of the first transistor T21 can have the first source region in the convex portion of the second region b on one side of the first gate electrode GAT1 and can have the first drain region in the convex portion of the second region b on the other side of the first gate electrode GAT1.

The second semiconductor layer ACT2 of the second transistor T22 can have convex portions in the first region a and the third region c on both sides of the second gate electrode GAT2 and can have concave portions in the second regions b on both sides of the second gate electrode GAT2.

The second semiconductor layer ACT2 of the second transistor T22 can have the second source region in the convex portions of the first region a and the third region c on one side of the second gate electrode GAT2 and can have the second drain region in the convex portions of the first region a and the third region c on the other side of the second gate electrode GAT2.

The first contact holes C1 can be formed in the first source region of the first semiconductor layer ACT1 and the second source region of the second semiconductor layer ACT2, and the first source region of the first semiconductor layer ACT1 and the second source region of the second semiconductor layer ACT2 can be electrically connected to the signal line SL through the first contact holes C1.

The second contact hole C2 can be formed in the first drain region of the first semiconductor layer ACT1 and the second drain region of the second semiconductor layer ACT2, and the first drain region of the first semiconductor layer ACT1 and the second drain region of the second semiconductor layer ACT2 can be electrically connected to the second gate power voltage (VGL) line through the second contact holes C2.

When the first transistor T21 and the second transistor T22 are stacked, the first source region and the first drain region and the second source region and the second drain region can be disposed such that they do not overlap.

Although FIG. 11 to FIG. 14 illustrate only various embodiments of the first semiconductor layer ACT1 and the second semiconductor layer ACT2, the configurations of the first semiconductor layer ACT1 and the second semiconductor layer ACT2 of the present disclosure can be equally applied to the configurations of the third semiconductor layer ACT1 and the fourth semiconductor layer ACT4.

According to aspects of the present disclosure, by using silicon transistors and oxide transistors together and the silicon transistors and oxide transistors are arranged in an overlapping form, the channel width of each transistor of the electrostatic discharge circuit can be doubled.

According to aspects of the present disclosure, since the channel width of each transistor of the electrostatic discharge circuit can be doubled, the occurrence of burnt or the like in the channel due to electrostatic current can be suppressed.

According to aspects of the present disclosure, since the occurrence of burnt or the like in the channel due to electrostatic current can be suppressed, the internal circuit connected to the signal line can be stably protected.

According to aspects of the present disclosure, since the internal circuit connected to the signal line can be stably protected, the production energy for producing the display apparatus can be reduced, and the emission of greenhouse gases due to the manufacturing process can be reduced, thereby achieving ESG (Environmental/Social/Governance) goals.

According to aspects of the present disclosure, it is possible to double the channel width of each transistor of the electrostatic discharge circuit by using silicon transistors and oxide transistors together and configuring the silicon transistors and oxide transistors in an overlapping form.

According to aspects of the present disclosure, since the channel width of each transistor of the electrostatic discharge circuit can be doubled, the occurrence of burnt, etc. in the channel due to electrostatic current can be prevented.

According to aspects of the present disclosure, since the occurrence of burnt, etc. in the channel due to electrostatic current can be curbed, the internal circuit connected to signal lines can be stably protected.

According to aspects of the present disclosure, since the internal circuit connected to the signal lines can be stably protected, the production energy for producing the display apparatus can be reduced, and the generation of greenhouse gases due to the manufacturing process can be reduced, and thus ESG (Environmental/Social/Governance) goals can be achieved.

The effects according to the embodiments of the present disclosure are not limited to the above description, and more diverse effects are included in the present disclosure.

It will be apparent to those skilled in the art that various modifications and variations can be made in the present disclosure without departing from the spirit or scope of the present disclosure. Thus, it is intended that the present disclosure covers the modifications and variations of the present disclosure provided they come within the scope of the appended claims and their equivalents.

What is claimed is:

1. An electrostatic discharge circuit comprising:
a signal line configured to transmit a gate signal or a data signal;
a first gate power voltage line;
a second gate power voltage line;
a first transistor and a second transistor disposed to overlap each other between the signal line and the second gate power voltage line; and
a third transistor and a fourth transistor disposed to overlap each other between the signal line and the first gate power voltage line.

2. The electrostatic discharge circuit of claim 1, wherein the first transistor and the third transistor include a silicon semiconductor transistor, and the second transistor and the fourth transistor include an oxide semiconductor transistor.

3. The electrostatic discharge circuit of claim 1, wherein the first transistor and the third transistor are PMOS transistors, and the second transistor and the fourth transistor are NMOS transistors.

4. The electrostatic discharge circuit of claim 1, further comprising:
a first shielding metal layer disposed between the first transistor and the second transistor; and
a second shielding metal layer disposed between the third transistor and the fourth transistor.

5. The electrostatic discharge circuit of claim 4, wherein the first shielding metal layer and the second shielding metal layer are electrically connected to the first gate power voltage line and the second gate power voltage line, respectively.

6. The electrostatic discharge circuit of claim 4, wherein the second transistor is disposed over the first transistor, and the fourth transistor is disposed over the third transistor, or
wherein the first transistor is disposed over the second transistor, and the third transistor is disposed over the fourth transistor.

7. The electrostatic discharge circuit of claim 1, wherein a first electrode of the first transistor is electrically connected to the second gate power voltage line,
wherein a second electrode and a gate electrode of the first transistor are electrically connected to the signal line,
wherein a first electrode and a gate electrode of the second transistor are electrically connected to the second gate power voltage line, and
wherein a second electrode of the second transistor is electrically connected to the signal line.

8. The electrostatic discharge circuit of claim 7, wherein a first electrode and a gate electrode of the third transistor are electrically connected to the first gate power voltage line,
wherein a second electrode of the third transistor is electrically connected to the signal line,
wherein a first electrode of the fourth transistor is electrically connected to the first gate power voltage line, and
wherein a second electrode and a gate electrode of the fourth transistor are electrically connected to the signal line.

9. The electrostatic discharge circuit of claim 1, wherein the first transistor includes a first semiconductor layer having a first channel region, a first source region, and a first drain region, and a first gate electrode,
wherein the second transistor includes a second semiconductor layer having a second channel region, a second source region, and a second drain region, and a second gate electrode,
wherein the first source region and the second source region are disposed not to overlap each other,
wherein the first drain region and the second drain region are disposed not to overlap each other,
wherein the first source region, the second source region, and the first gate electrode are electrically connected to the signal line, and
wherein the first drain region, the second drain region, and the second gate electrode are electrically connected to the second gate power voltage line.

10. The electrostatic discharge circuit of claim 9, wherein the third transistor includes a third semiconductor layer having a third channel region, a third source region, and a third drain region, and a third gate electrode,
wherein the fourth transistor includes a fourth semiconductor layer having a fourth channel region, a fourth source region, and a fourth drain region, and a fourth gate electrode,
wherein the third source region and the fourth source region are disposed not to overlap each other,
wherein the third drain region and the fourth drain region are disposed not to overlap each other,
wherein the third source region, the fourth source region, and the fourth gate electrode are electrically connected to the signal line, and
wherein the third drain region, the fourth drain region, and the third gate electrode are electrically connected to the first gate power voltage line.

11. The electrostatic discharge circuit of claim 10, wherein the first semiconductor layer to the fourth semiconductor layer each include a plurality of regions having a same width in a respective longitudinal direction of the first gate electrode to the fourth gate electrode, the plurality of regions including a first region, a second region, a third region, a fourth region, a fifth region and a sixth region,
wherein the first semiconductor layer or the third semiconductor layer has convex portions in the first region, the third region, and the fifth region on some sides of the first gate electrode or the third gate electrode, and has concave portions in the second region, the fourth region, and the sixth region on some sides of the first gate electrode or the third gate electrode, and wherein the first semiconductor layer or the third semiconductor layer has the first source region or the third source region in the convex portions of the first region, the third region, and the fifth region on one side of the first gate electrode or the third gate electrode, and has the first drain region or the third drain region in the convex portions of the first region, the third region, and the fifth region on the other side of the first gate electrode or the third gate electrode.

12. The electrostatic discharge circuit of claim 11, wherein the second semiconductor layer or the fourth semiconductor layer has concave portions in the first region, the third region, and the fifth region on some sides of the second gate electrode or the fourth gate electrode, and has convex portions in the second region, the fourth region, and the sixth region on some sides of the second gate electrode or the fourth gate electrode, and wherein the second semiconductor layer or the fourth semiconductor layer has the second source region or the fourth source region in the convex portions of the second region, the fourth region, and the sixth region on one side of the second gate electrode or the fourth gate electrode, and has the second drain region or the fourth drain region in the convex portions of the second region, the fourth region, and the sixth region on the other side of the second gate electrode or the fourth gate electrode.

13. The electrostatic discharge circuit of claim 10, wherein the first semiconductor layer to the fourth semiconductor layer include a plurality of regions having a same width in a longitudinal direction of the first gate electrode to the fourth gate electrode, wherein the first semiconductor layer or the third semiconductor layer has convex portions in a first region of the plurality of regions on some sides of the first gate electrode or the third gate electrode, and has concave portions in a second region of the plurality of regions on some sides of the first gate electrode or the third gate electrode, and wherein the first semiconductor layer or the third semiconductor layer has the first source region or the third source region in the convex portions of the first region on one side of the first gate electrode or the third gate electrode, and has the first drain region or the third drain region in the convex portions of the first region on the other side of the first gate electrode or the third gate electrode.

14. The electrostatic discharge circuit of claim 13, wherein the second semiconductor layer or the fourth semiconductor layer has concave portions in the first region on some sides of the second gate electrode or the fourth gate electrode, and has convex portions in the second region on some sides of the second gate electrode or the fourth gate electrode, and wherein the second semiconductor layer or the fourth semiconductor layer has the second source region or the fourth source region in the convex portions of the second region on one side of the second gate electrode or the fourth gate electrode, and has the second drain region or the fourth drain region in the convex portions of the second region on the other side of the second gate electrode or the fourth gate electrode.

15. The electrostatic discharge circuit of claim 10, wherein the first semiconductor layer to the fourth semiconductor layer are divided into a plurality of regions in a longitudinal direction of the first gate electrode to the fourth gate electrode, first and second regions of the plurality of regions having a same width, and a width of third and fourth regions of the plurality of regions being twice the width of the first and second regions, wherein the first semiconductor layer or the third semiconductor layer has convex portions in the first region and the third region on some sides of the first gate electrode or the third gate electrode, and has concave portions in the second region and the fourth region on some sides of the first gate electrode or the third gate electrode, and wherein the first semiconductor layer or the third semiconductor layer has the first source region or the third source region in the convex portions of the first region and the third region on one side of the first gate electrode or the third gate electrode, and has the first drain region or the third drain region in the convex portions of the first region and the third region on the other side of the first gate electrode or the third gate electrode.

16. The electrostatic discharge circuit of claim 15, wherein the second semiconductor layer or the fourth semiconductor layer has concave portions in the first region and the third region on some sides of the second gate electrode or the fourth gate electrode, and has convex portions in the second region and the fourth region on some sides of the second gate electrode or the fourth gate electrode, and wherein the second semiconductor layer or the fourth semiconductor layer has the second source region or the fourth source region in the convex portions of the second region and the fourth region on one side of the second gate electrode or the fourth gate electrode, and has the second drain region or the fourth drain region in the convex portions of the second region and the fourth region on the other side of the second gate electrode or the fourth gate electrode.

17. The electrostatic discharge circuit of claim 10, wherein the first semiconductor layer to the fourth semiconductor layer are divided into a plurality of regions in a longitudinal direction of the first gate electrode to the fourth gate electrode, first and third regions of the plurality of regions having a same width, and a width of a second region of the plurality of regions being twice the width of the first and third regions, wherein the first semiconductor layer or the third semiconductor layer has convex portions in the second region on some sides of the first gate electrode or the third gate electrode, and has concave portions in the first region and the third region on some sides of the first gate electrode or the third gate electrode, and wherein the first semiconductor layer or the third semiconductor layer has the first source region or the third source region in the convex portion of the second region on one side of the first gate electrode or the third gate electrode, and has the first drain region or the third drain region in the convex portion of the second region on the other side of the first gate electrode or the third gate electrode.

18. The electrostatic discharge circuit of claim 17, wherein the second semiconductor layer or the fourth semiconductor layer has convex portions in the first region and the third region on some sides of the second gate electrode or the fourth gate electrode, and has concave portions in the second region on some sides of the second gate electrode or the fourth gate electrode, and wherein the second semiconductor layer or the fourth semiconductor layer has the second source region or the fourth source region in the convex portions of the first region and the third region on one side of the second gate electrode or the fourth gate electrode, and has the second drain region or the fourth drain region in the convex portions of the first region and the third region on the other side of the second gate electrode or the fourth gate electrode.

19. A display apparatus comprising:
a display panel configured to display images, and including a plurality of data lines, a plurality of gate lines, and a plurality of pixels arranged thereon;
the electrostatic discharge circuit according to claim 1 and connected to the plurality of data lines or the plurality of gate lines;
a gate driving circuit configured to supply a scan signal to the plurality of gate lines;
a data driving circuit configured to supply a data signal to the plurality of data lines; and
a controller configured to control operation timings of the gate driving circuit and the data driving circuit.

20. An electrostatic discharge circuit comprising:
a signal line;
a first gate power voltage line;
a second gate power voltage line;
a first transistor and a second transistor disposed between the signal line and the second gate power voltage line; and
a third transistor and a fourth transistor disposed between the signal line and the first gate power voltage line,
wherein, when a voltage higher than a first gate power voltage is applied to the signal line, the third transistor and the fourth transistor are turned on, and when a voltage lower than a second gate power voltage is applied to the signal line, the first transistor and the second transistor are turned on, so that a voltage at the signal line is maintained between the first gate power voltage and the second gate power voltage.

* * * * *